US012640392B2

(12) United States Patent
Anastasopoulos et al.

(10) Patent No.: US 12,640,392 B2
(45) Date of Patent: May 26, 2026

(54) METHOD FOR PREPARING AMORPHOUS LITHIUM BOROSILICATE

(71) Applicant: ILIKA TECHNOLOGIES LTD, Romsey (GB)

(72) Inventors: Alexandros Anastasopoulos, San Francisco, CA (US); Brian Elliott Hayden, Lyndhurst (GB); Christopher Lee, Southampton (GB); David Laughman, Acton, MA (US); Duncan Smith, Malmesbury (GB); Gianfranco Aresta, Southampton (GB); Louise Turner, Salisbury (GB); Samuel Guerin, Southampton (GB)

(73) Assignee: ILIKA TECHNOLOGIES LTD, Romsey (GB)

( * ) Notice: Subject to any disclaimer, the term of this patent is extended or adjusted under 35 U.S.C. 154(b) by 958 days.

(21) Appl. No.: 17/781,813

(22) PCT Filed: Dec. 1, 2020

(86) PCT No.: PCT/GB2020/053075
§ 371 (c)(1),
(2) Date: Jun. 2, 2022

(87) PCT Pub. No.: WO2021/111118
PCT Pub. Date: Jun. 10, 2021

(65) Prior Publication Data
US 2023/0044368 A1     Feb. 9, 2023

(30) Foreign Application Priority Data

Dec. 5, 2019     (GB) ...................................... 1917824

(51) Int. Cl.
*H01M 10/0562* (2010.01)
*C23C 14/10* (2006.01)
*C23C 14/24* (2006.01)

(52) U.S. Cl.
CPC ......... *H01M 10/0562* (2013.01); *C23C 14/10* (2013.01); *C23C 14/24* (2013.01); *H01M 2300/0068* (2013.01)

(58) Field of Classification Search
None
See application file for complete search history.

(56) References Cited

U.S. PATENT DOCUMENTS 4,374,162 A     2/1983     Takagi
4,933,058 A     6/1990     Bache
(Continued)

FOREIGN PATENT DOCUMENTS

CN     1359165 A     7/2002
CN     1773763     5/2006
(Continued)

OTHER PUBLICATIONS

Sun, et al., Phase separation and electrical conductivity of lithium borosilicate glasses for potential thin film solid electrolytes, 162 (2) Journal of Power Sources, 1341-1345, Nov. 22, 2006. (Year: 2006).*
(Continued)

*Primary Examiner* — Nicole M. Buie-Hatcher
*Assistant Examiner* — Krishna R Hammond
(74) *Attorney, Agent, or Firm* — Renner, Otto, Boisselle & Sklar, LLP

(57) ABSTRACT

The present invention provides a vapour deposition method for preparing an amorphous lithium borosilicate or doped lithium borosilicate compound, the method comprising: providing a vapour source of each component element of the compound, wherein the vapour sources comprise at least a
(Continued)

Conductivity / S.cm⁻¹ source of lithium, a source of oxygen, a source of boron, and a source of silicon, and, optionally, a source of at least one dopant element; delivering a flow of said lithium, said oxygen, said boron and said silicon, and, optionally, said dopant element; and co-depositing the component elements from the vapour sources onto a substrate wherein the component elements react on the substrate to form the amorphous compound; wherein the amorphous lithium borosilicate or doped lithium borosilicate compound has a lithium content in the range 40-65 atomic %, based on the combined atomic percentages of lithium, boron and silicon.

19 Claims, 5 Drawing Sheets

(56)                    References Cited

U.S. PATENT DOCUMENTS

| | | | | |
|---|---|---|---|---|
| 5,016,563 | A | 5/1991 | Murakami et al. | |
| 5,128,007 | A | 7/1992 | Matsunaga et al. | |
| 5,338,625 | A | 8/1994 | Bates et al. | |
| 5,804,054 | A | 9/1998 | Bhattacharya et al. | |
| 6,017,654 | A | 1/2000 | Kurnta et al. | |
| 6,214,061 | B1 | 4/2001 | Visco et al. | |
| 6,632,563 | B1 | 10/2003 | Krasnov | |
| 6,863,699 | B1 | 3/2005 | Krasnov et al. | |
| 6,982,132 | B1 | 1/2006 | Goldner et al. | |
| 7,883,800 | B2 | 2/2011 | Vinatier et al. | |
| 10,490,805 | B2 | 11/2019 | Smith et al. | |
| 2001/0032666 | A1 | 10/2001 | Jenson | |
| 2001/0041294 | A1 | 11/2001 | Chu et al. | |
| 2002/0106456 | A1 | 8/2002 | Kugai et al. | |
| 2003/0186128 | A1 | 10/2003 | Singh | |
| 2004/0058237 | A1 | 3/2004 | Higuchi | |
| 2004/0258984 | A1 | 12/2004 | Ariel | |
| 2005/0016458 | A1 | 1/2005 | Zhang | |
| 2005/0130032 | A1 | 6/2005 | Krasnov et al. | |
| 2005/0147890 | A1 | 7/2005 | Shembel et al. | |
| 2009/0026065 | A1 | 1/2009 | Nukeaw | |
| 2009/0057136 | A1 | 3/2009 | Wang et al. | |
| 2009/0081554 | A1 | 3/2009 | Takada | |
| 2010/0068617 | A1 | 3/2010 | Bedjaoui et al. | |
| 2010/0104942 | A1 | 4/2010 | Lange | |
| 2010/0261071 | A1 | 10/2010 | Lopaiin | |
| 2011/0319034 | A1 | 12/2011 | Boe et al. | |
| 2012/0058280 | A1 | 3/2012 | Chung | |
| 2012/0058380 | A1 | 3/2012 | Wang et al. | |
| 2012/0237835 | A1 | 9/2012 | Yada | |
| 2013/0011738 | A1 | 1/2013 | Zhou | |
| 2013/0136981 | A1 | 5/2013 | Peuchert | |
| 2013/0189588 | A1 | 7/2013 | Yada et al. | |
| 2014/0001412 | A1 | 1/2014 | Munnangi et al. | |
| 2014/0178750 | A1 | 6/2014 | Anji Reddy et al. | |
| 2015/0203975 | A1 | 7/2015 | Hoormann | |
| 2016/0336583 | A1* | 11/2016 | Smith et al. | |
| 2016/0340772 | A1 | 11/2016 | Smith | |
| 2016/0340784 | A1 | 11/2016 | Hayden et al. | |
| 2017/0229734 | A1* | 8/2017 | Furukawa | H01M 4/0414 |
| 2019/0341652 | A1* | 11/2019 | Laughman | |

FOREIGN PATENT DOCUMENTS

| | | | | | |
|---|---|---|---|---|---|
| CN | 101479403 | | 7/2009 | | |
| CN | 105917018 | A | 8/2016 | | |
| CN | 106495671 | | 3/2017 | | |
| CN | 106716549 | A | 5/2017 | | |
| CN | 109468595 | A | 3/2019 | | |
| DE | 10342974 | | 4/2005 | | |
| DE | 10355236 | | 6/2005 | | |
| EP | 0454499 | | 11/1996 | | |
| EP | 1305838 | | 2/2007 | | |
| EP | 1900845 | | 3/2008 | | |
| EP | 2824738 | | 1/2014 | | |
| GB | 1595632 | | 4/1978 | | |
| GB | 2493020 | | 1/2013 | | |
| GB | 2493022 | | 1/2013 | | |
| JP | S63-035493 | | 2/1988 | | |
| JP | H04187759 | | 12/1989 | | |
| JP | H01317199 | | 7/1992 | | |
| JP | H08329944 | | 12/1996 | | |
| JP | 2003277915 | | 10/2003 | | |
| JP | 2005038844 | | 2/2005 | | |
| JP | 2006/120437 | | 5/2006 | | |
| JP | 2013-151721 | | 8/2013 | | |
| JP | 2013-187024 | | 9/2013 | | |
| JP | 2015-056208 | | 3/2015 | | |
| JP | 2017-503913 | A | 2/2017 | | |
| JP | 2019518311 | A | 6/2019 | | |
| KR | 20030043177 | A * | 6/2003 | | H01M 10/052 |
| KR | 20030094759 | | 12/2003 | | |
| KR | 20040098139 | | 11/2004 | | |
| KR | 20080003679 | | 1/2008 | | |
| KR | 20170008539 | A | 1/2017 | | |
| WO | 2001073957 | | 4/2001 | | |
| WO | 2005035820 | | 4/2005 | | |
| WO | 2005038844 | | 4/2005 | | |
| WO | 2013011326 | | 1/2013 | | |
| WO | 2013011327 | | 1/2013 | | |
| WO | 2015104538 | | 7/2015 | | |
| WO | 2015104540 | | 7/2015 | | |
| WO | 2016075921 | A1 | 5/2016 | | |
| WO | 2017216532 | | 12/2017 | | |
| WO | 2020044042 | | 3/2020 | | |

OTHER PUBLICATIONS

1 First Examination Report issued to the corresponding Japanese application No. 2021-502892 on Aug. 15, 2023.

Ito, et al., "Ionic Conductivity Of Li2O—B2O3 Thin Films," Journal of Non-Crystalline Solids, 57, 1983, pp. 389-400.

Rim, et al., "Synthesis and Conductivity of the Lithium-rich Borosilicate Glass System," Journal of the Korean Physical Sociey, vol. 61, No. 6, Sep. 2012, pp. 988-991.

Neyret, et al. "Ionic transport of alkali in borosilicate glass. Role of alkali nature on glass structure and on ionic conductivity at the glassy state," Journal of Non-Crystaline Solids, 400, 2015, pp. 74-91.

International Search Report and Written Opinion mailed Mar. 4, 2021 in corresponding International Application No. PCT/GB2020/053075.

Search Report mailed Jun. 5, 2020 in corresponding United Kingdom Application No. 1917824.3.

Satyanarayanaa, et al.,"Investigation of sol-gel route in the synthesis of lithium ion conducting glasses," Solid State Ionics, 86-88, 1996, pp. 543-546.

Maia, et al., Electrical Conductivity and relaxation frequency of lithiurn borosilicate glasses, Solid State Ionics 168, 2004, pp. 87-92.

Lee, et al., "Phase separation and electrical conductivity of lithium borosilicate glasses for potential thin film solid electrolytes," Journal of Power Sources, 162, (2006), pp. 1341-1345.

Kluvanek, et al., "Investigation of the conductivity of the lithium borosilicate glass system," Journal of Non-Crystalline Solids, 353, (2007), 2004-2007.

Kim, et al., "Fabrication of a high lithium ion conducting lithium borosilicate gllass," Journal of Non-Crystalline Solids, 357, 2011, pp. 2863-2867.

Bates et al.; "A Stable Thin-Film Lithium Electrolyte: Lithium Phosphorns Oxynitride", Journal of the Electroctlemical Society 144 [2] (1997) 524-533.

Kim, et al. "Effect of SiO2/B2O3 ratio on Li ion conductivity of a Li2O-B2O3-SiO2 glass electrolyte," Journal of Ceramic Processing Research, vol. 13, Special 1, (2012), s37-s41.

Julien, et al., Chapter 1. Design and Optimisation of Solid State Batteries. In Solid State Batteries: Materials Design and Optimization, 1994, 49-51.

Bates, et al., "Rechargeable Thin Film Lithium Batteries," Oak Ridge National Lab and Solid State Ionics 1993.

(56)     References Cited

OTHER PUBLICATIONS

Tatsumisago, et al., "Mixed Anion Effect in Conductivity of Rapidly Quenched Li4SiO4-Li3BO3 Glasses," Yogyo-Kyokai-Shi 1987, 95, (2), 197-201.

Machida, et al., "Preparation of Amorphous Films in the Systems Li2O—SiO2 and Li2O—B2O3—SiO2 by Rf-Sputtering and Ttieir Ionic Conductivity," Yogyo-Kyokai-St1i 95, 1987, p. 135-i 37.

Julien, et al., Chapter 4. Materials for electrolyte: Thin Films. In Solid State Batteries: Materials Design and Optimization, 1994.

Varshneya, A. K., Fundamentals of Inorganic Glasses, Academic Press, p. 33, 1994.

Guerin et al.; "Physical Vapor Deposition Method for the High-Throughout Synthesis of Solid-State Material Libraries", Journal of Combined Chemistry, 2006, vol. 8, pp. 66-73.

Guerin, et al., "Synthesis and Screening of Phase Change Chalcogenide Thin Film Materials for Data Storage," ACS Comb. Sci. 2017, 19, 478-491.

Glass, et al., "Anomalous dielectric behavior and reversible pyroelectrivity in roller-quenched LiNbO3, and LiTaO3 glass," Applied Physics Letters, 31, (1977) 249.

Glass, et al., "Lithium ion conduction in rapidly quenched Li2O—Al2O3, Li2O—Ga2O3, and Li2O-Bi2-03," Journal of Applied Physics, 51, (1980) 3756.

Yada, et al., "Dielectric Modification of 5V-Class Cathodes for High-Voltage All-Solid-State Lithium Batteries," Advanced Energy Materials 2014, 4, 1301416.

Glass, et al., "Ionic conductivity of quenched alkali niobate and tantalate glasses," J Appl Phys, 49, (1978) 4808.

Tatsumisago, et al., "Ionic Conductivity of Rapidly Quenched Glasses with High Concentration of Lithium Ions," Journal of Non-Crystalline Solids, 95 & 96, 1987, pp. 857-864.

Umesaki, N., et al., Structure of Rapidly Quenched Glasses in the System Li2O—SiO2. Journal of Materials Science, 1993. 28(13): p. 3473-3481.

Muralidharan, et al., "AC conductivity studies of lithium borosilicate glasses: synthesized by sol-gel process with various concentrations of nitric acid as a catalyst," Materials Chemistry and Physics 88 (2004) 138-144.

Muralidharan, et al., "Sol-gel synthesis, characterization and impedance studies of lithium borosilicate glass," Materials Research Bulletin 39(11), Sep. 2004, Abstract only, https://www.researchgate.net/publication/240386040_Sol-gel_synthesis_characterization_and_impedance_studies_of_lithium_ borosilicate glass.

Zhu et al; "First principles study on electrochemical and chemical stability of solid electrolyte-electrode interfaces in all-solid-state Li-ion batteries", Journal of Materials Chemistry A 2016 4 3253-3266; and supplementary information.

Tatsumisago, et al., "Rapid Quenching Technique Using Thermal-Image Furnace for Glass Preparation," Communications of the American Ceramic Society, Jul. 1981, pp. C97-C98.

N.S. Saetova et al.: The influence of lithium oxide concentration on the transparent properties of glasses in the Li2O—B2O3-SiO2 system11 , Journal Of Non-Crystalline Solids., vol. 443, Apr. 22, 2016 (Apr. 22, 2016), pp. 75-81.

Liu, et al., " Mechanisrn of lithium storage in Si—O—C composite anodes," Journal of Power Sources 196, 2011, pp. 10667-10672, Changsha, People's Republic of China.

Jin, et al., "Raman Studies of Lithium Borophosphate Glasses," Journal of Non-Crystalline Solids 112,1989, p. 145-·150, North-Holland, Amsterdam.

Wang, et al., "Structural role of lead in lead silicate glasses derived from XPS spectra," Journal of Non-Crystalline Solider 194, 1996, pp. 129-134.

Shiraishi, et al., "Study of the Surface Composition of Highly Smooth Litt1ium Deposited in Various Carbonate Electrolytes Containin~i HF," American Chernical Society, Langmuir, vol. 13, No. 13, .1997, pp. 3542-3549.

Rinke, et al., The mixed network former effect in glasses: solid state NMR and XPS structural studies of the glass system (Na2O)x(BPO4)1-x, Phys. Chem. Chem. Phys., www.rsc.org/pccp, 2011, 13, pp. 6552-6565.

Raskar, et al., The Mixed-Network Former Effect in Phosphate Glasses: NMR and XPS Studies of the Connectivity Distribution in tte Glass System (NaPO3)1-x(B2O3)x, J. Phys. Chern. C, 2008, 112, pp. 12530-12539.

Nocun, "Structural studies of phosphate glasses with high ionic conductivity," Journal of Non-Crystalline Solids, 333, 2004, pp. 90-94.

Miyachi, et al., "Analysis of SiO Anodes for litt1ium-lon Batteries," Journal of The Electrochemical Society, 152, 10, 2005, pp. A2089-A2091.

Konijnendijk, et al., "The Structure of Borosilicate Glasses Studied by Raman Scattering," Journal of Non-Crystalline Solids, 20, 1976, pp. 193-224, North-Holland, Amsterdam.

Goodenough, "Design considerations," Solid State Ionics 69, 1994, pp. 184-198.

Kowada, et al., "Raman Spectra of Rapidly Quenched Glasses in the Systems Li3BO3—Li4SiO4—Li3PO4 and Li4B2O5—Li6Si2O7—Li4P2O7," The Journal of Physical Chemistry, vol. 93, No. 5, 1989, pp. 2147-2151.

Tatsumisago, et al., "Raman spectra of rapidly quenched Li4SiO4—Li3BO3 glasses," Physics and Chem of Glasses 28, 1987, pp. 95-96.

Tatsumisago, et al., Structural Investigation of Rapidly Quenct1ed Ii2O-B2O3 Glasses by Raman Spectroscopy, Yogyo-Kyokai-Shi 94 [5], 1986, pp. 464-469.

Levasseur, et al., "Elaboration and Characterization of Lithium Conducting Thin Film Glasses," Solid State Ionics 9 & 10, North Holland Publist1ing Company, 1983, pp. 1439-1444.

Efimov, "Vibrational spectra, related properties, and structure of inorganic glasses," Journal of Non-Crystalline Solids, 253, .1999, pp. 95-118.

Dalby, et al., "Resolution of bridging oxygen signals from O 1s spectra of silicate glasses usin~1 XPS: Implications for O and Si speciation," Geoct1imica et Cosmochirnica Acta 71, www.elsevier.com/locate/gca, 2007, pp. 4297-4313.

Brooker, et al., "Raman and Infrared Spectral Studies of Anhydrous Li2CO3 and Na2CO3", The Journal of Chemical Physics, vol. 54, No. ·1·1, Jun. 1, 1971, pp. 4788-4796.

Touati, et al., "Preparation and characterization of mesoporous lithium borosilicate material via U1e solgel process," Materials Science and Engineering, C, 29, 2009, pp. 1239-1244.

Tsuchiya, et al., Anomalous Behavior of Physical and Electrical Properties in Borophosphate Glasses Containing R2O and V2O5, Journal of Non-Crystalline Solids, 38 & 39, North-Holland Publishing Company, 1980, pp. 323-328.

Touati, et al., "Structure and texture of heat-treated lithium borosilicate xerogel," Materials Chemistry and Physics, 101, 2007, pp. 352-356.

Meunier, et al., "New Positive-electrode Materials for Lithium Thin Film Secondary Batteries*," Materials Science and Engineering, B3, 1989, pp. 19-23.

Baggetto et al.; "Fabrication and characterization of Li—Mn—Ni—O sputtered thin film high voltage cathodes for Li-ion batteries", Journal of Power Sources, 20.12, vol. 211, pp. 108-118.

Kim, et al., "Laser-printed thick-film electrodes for solid-state rechargeable Li-ion microbaiteries," Journal of Power Sources, 165, 2007, pp. 413-419.

Wartena, et al., "Li-ion microbatteries generated by a laser direct-write method," Journal of Power Sources, 126, 2004, pp. 193-202.

Wang, et al., "A meso-macroporous borosilicate monolith prepared by a sol-gel method," Microporous and Mesoporous Materials, 151, 2012, pp. 250-254.

Creus, et al., "The Use of Ionic and Mixed Conductive Glasses in Microbatteries", Materials Science and Engineering, B3, 1989, pp. 109-112.

Lee, et al., "Electrochemical performance of lithium/sulfur batteries with protected Li anodes," Journal of Power Sources, https://www.researcl1gate.net/publication/245105584, Jun. 2003.

Tatsumisago, et al., "Preparation of Rapidly Quenched Glasses in Pseudobinary Systems Composed of Lithium Ortho-Oxosalts," Journal of the American Ceramic Society, Nov. 1983, pp. C210-C211.

(56)        References Cited

OTHER PUBLICATIONS

Kim, et al., "High voltage stability of LiCoO2 paiiicles with a nano-scale Upon coating," Electrochimica Acta, 56, 2011, pp. 6573-6580.

Tatsumisago, "Raman Spectra of Li2O-SiO2 Glasses Prepared by Rapid Quenctling," The Chemical Society of Japan, Chemistry Letters, 1986, pp. 1371-1374.

Goodenough, et al., "Challenges for Rechargeable Li Batteries," Chemistry of Materials Review, 22, 2010, pp. 587-603.

Manthiram, et al., "Lithium-Sulfur Batteries: Progress and Prospects," Advanced Materials, 27, 2015, pp. 1980-2006.

Zhu, et al., "Origin of Outstanding Stability in the Lithium Solid Electrolyte Materials: Insights from Thermodynamic Analyses Based on First-Principles Calculations," ACS Applied Materials & Interfaces, 7, 2015, pp. 23685-23693.

Reddy, et al., "Metal Oxides and Oxysalts as Anode Materials for Li Ion Batteries," Chemical Reviews, 113, 2013, pp. 5364-5457.

Bates, et al., CRADA Final Report for CRADA No. ORNL90-0038, Development of Lithium Microbattery Packaging Technology ERKTS01, Oak Ridge National laboratory, Mmtin Marietta, pp. 1-7.

Chryssikos, et al., "On the Structure of Alkali Borate Glasses Approaching the Orthoborate Composition," Materials Science and Engineering, B7, 1990, pp. ·i-4, The Netherlands.

Tatsumisago, et al., "Structure of rapidly quenched lithium phosphate glasses," Physics and Chemistry of Glasses, vol. 29, No. 2, Apr. 1988, pp. 63-66.

Jayanth Babu, et al.; "Microstructural and electrochemical properties of rf-sputtered LiMn2O4 ttl in film cathodes", Appl. Nanosci. 2012, vol. 2, pp. 401-407.

Samuneva et al. Structure and optical properties of niobium silicate glasses. Journal of Non-crystalline solids. vol. 129, Issues 1-3. Mar. 1991, pp. 54-63.

Beal et al.; "High Throughput Methdology for Synthesis, Screening, and Optimization of Solid State Lithium Ion Electrolytes", ACS Combinatorial Science, 2011, vol. 13 Issue 4, pp. 375-38.

Wang et al.; "Synthesis, Crystal Structure, and Ionic Conductivity of a Polycrystalline Lithium Phosphorus Oxynitride with the y-Li3PO4 Structure", Journal of Solid State Ctlemistry, 1995, vol. 115(2), pp. 313-323, Abstract.

Park et al.; "Characterization of tin oxide/LiMn2O4 thin-film cell", Journal of Power Sources, 2000, vol. 88, pp. 250-254.

Chen et al.; "High rate performance of LiMn2O4 cathodes for lithium ion batteries synthesized by low temperature oxygen plasma assisted sol-gel process", Thin Solid Films, 2013, vol. 544, pp. 182-185.

Zhong et al.; "Synthesis and Electrochermistry of IiNixMn2—XO4" Journal of Electrochemical Society, 1997, vol. 144(1), pp. 205-213.

Hu et al.; "Influence of sputtering pressure on the structure and ionic conductivity of thin film amorphous electrolyte", Journal of Material Science, 2011, vol. 46, pp. 7588-7593.

Choi et al.; "Radio-Frequency Magnetron Sputtering Power Effect on the Ionic Conductivities of Upon Films", Electrochemical and Solid-State Letters, 2002, vol. 5(1), pp. A14-A17.

Zhao et al.; "A solid-state electrolyte lithium phosphorus oxynitride film prepared by pulsed laser deposition", Ttlin Solid Films, 2002, vol. 415, pp. 108-113.

Munoz, et al., "Composition and structure dependence of the properties of lithium borophosphate glasses showing boron anomaly," Journal of Non-Crystalline Solids, 355, 2009, pp. 2571-2577.

Miura, et al., "X-ray photoelectron spectroscopy of sodium borosilicate glasses," Journal of Non-Crystalline Solids, 290, 2001, pp. 1-14.

Tang et al.; "Comparative study of UMn2O4 thin film cathode grown at high, medium and low temperatures by pulsed laser deposition", Journal of Solid State Chemistry, 2006, vol. 179 (12), pp. 3831-3838.

Thornton et al.; "Sputter Deposition Processes", Handbook of Deposition Technologies for Films and Coatings, ·1994, second edition, pp. 249-272.

Wang et al.; "High power and capacity of LiNi0.5Mn1.504 thin films cathodes prepared by pulsed laser deposition", Electrochimica Acta. 2013, vol. 102, pp. 416-422.

Singh et al.; "Challenges in making of H1in films for LixMnyO4 rechargeable lithoum batteries for MEMS", Journal of Power Sources, 2001, vol. 97-98, pp. 826-831.

Zhang, "A review of the electrochemical performance of alloy anodes for lithiu,-ion batteries," Journal of Power Sources, 196, (2011), 13-24.

Ren et al., "Oxide Electrolytes for Lithium Batteries," J. Am. Ceram. Soc., 98 [12], (2015), 3603-3623.

Sahan et al., "Improvement of the electrochemical performance of LiMn2O4 cathode active material by lithium borosilicate (LBS) surface coating for lithium-ion batteries," Journal of Alloys and Compounds, 509, (2011), 4235-4241.

Bachman et al., "Inorganic Solid-State Electrolytes for Lithium, Batteries: Mechanisms and Properties Governing Ion Conduction," Chem. Rev. 2016, 116, 140-162.

Joo et al., "Thin film lithium ion conducting LiBSO solid electrolyte," Solid State Ionics, 160, (2003), 51-59.

Japanese Office Action for corresponding Japanese Application No. 2022-529119, issued Sep. 24, 2024, with English translation.

* cited by examiner

Crystallisation temperature / °C 320  340  360  380  400  420  440  460  480

METHOD FOR PREPARING AMORPHOUS LITHIUM BOROSILICATE

This application is a national phase of International Application No. PCT/GB2020/053075 filed Dec. 1, 2020, which claims priority to United Kingdom Application No. 1917824.3 filed Dec. 5, 2019, each of which is hereby incorporated herein by reference in its entirety.

FIELD OF THE INVENTION

The present invention relates to a method for preparing amorphous lithium borosilicate or doped lithium borosilicate compounds by vapour deposition.

BACKGROUND TO THE INVENTION

The deposition of materials in thin film form is of great interest owing to the many applications of thin films, and a range of different deposition techniques are known. Various techniques are more or less suitable for particular materials, and the quality, composition and properties of the thin film produced typically depends greatly on the process used for its formation. Consequently, much research is devoted to developing deposition processes that can produce thin films appropriate for specific applications.

An important application of thin film materials is in solid state thin film cells or batteries, such as lithium ion cells. Such batteries are composed of at least three components. Two active electrodes (the anode and the cathode) are separated by an electrolyte. Each of these components is formed as a thin film, deposited in sequence on a supporting substrate. Additional components such as current collectors, interface modifiers and encapsulations may also be provided. In manufacture, the components may be deposited in the order of cathode current collector, cathode, electrolyte, anode, anode current collector and encapsulation, for example.

In the lithium ion example, the anode and the cathode are capable of reversibly storing lithium. Other requirements of the anode and cathode materials are high gravimetric and volumetric storage capacities which can be achieved from a low mass and volume of material, while the number of lithium ions stored per unit should be as high as possible. The materials should also exhibit acceptable electronic and ionic conduction so that ions and electrons can move through the electrodes during the battery charge and discharge process.

Otherwise, the anode and cathode require different properties. The cathode should present reversible lithium intercalation at high potentials, while the anode should present reversible lithium intercalation at low potentials.

The electrolyte physically separates the anode and cathode, so it must have extremely low electrical conductivity to prevent short circuiting of the battery. However, to enable reasonable charge and discharge properties, the ionic conductivity of the material must be as high as possible. Furthermore the material must be stable during the both the manufacturing and cycling processes and not react with either the cathode or the anode.

A significant challenge in solid state battery development has been the identification of solid electrolytes with sufficiently high ionic conductivity, low electronic conductivity, low mechanical stress resulting from required electrochemical cycling and reproducible high yield production methods.

Both crystalline and non-crystalline (amorphous) materials have been considered as electrolytes. Crystalline materials such as lithium lanthanum titanate (LLTO), thio-LISICON, NASICON-type $(Li_{1+x+y}Al_x(Ti,Ge)_{2-x}Si_yP_{3-y}O_{12})$, and $Li_{10}GeP_2S_{12}$ generally exhibit excellent ionic conductivity (for example up to $1.2\times10^{-2}$ S cm$^{-1}$ in the case of $Li_{10}GeP_2S_{12}$) so appear to be good candidates for electrolytes. However, these materials present problems when applied to battery systems. In the case of the oxides (LLTO, thio-LISICON and NASICON-type) the transition metals within the electrolyte are prone to reduction which causes the material to exhibit electronic conductivity and thus short circuit the battery. The sulphide systems, such as $Li_{10}GeP_2S_{12}$, present extremely high conductivities but are prone to decomposition when exposed to air and water, causing the release of toxic H$_2$S and a deterioration in performance. Furthermore, both oxide and sulphide crystalline electrolytes require extremely high processing temperatures. For these reasons crystalline electrolytes have not been utilised in commercial thin film battery systems.

Amorphous electrolytes such as lithium phosphorous oxynitride (LiPON), lithium silicate and lithium borosilicates exhibit much lower levels of ionic conductivity. Although the optimum conductivity of these materials is approximately two orders of magnitude lower than that of the crystalline materials, this has been determined to be acceptable if the electrolyte is less than $1\times10^{-6}$ m thick (Julien, C. M.; Nazri, G. A., Chapter 1. Design and Optimisation of Solid State Batteries. In *Solid State Batteries: Materials Design and Optimization*, 1994). LiPON has an acceptable ionic conductivity of $3\times10^{-6}$ S cm$^{-1}$ and has been shown to be stable in air and when cycled against lithium. For these reasons, coupled with its ease of manufacture, it has been widely adopted in the first generation of solid state batteries (Bates, J. B.; Gruzalski, G. R.; Dudney, N. J.; Luck, C. F.; Yu, X., Rechargeable Thin Film Lithium Batteries. *Oak Ridge National Lab and Solid State Ionics* 1993; Bates, J. B.; Dudney, N. J.; Neudecker, B.; Gruzalski, G. R.; Luck, C. F. Thin Film Battery and Method for Making Same, U.S. Pat. No. 5,338,625). The amorphous nature of these electrolytes is critical to their performance; crystalline LiPON has an ionic conductivity seven orders of magnitude lower than the amorphous material.

Hence, amorphous electrolytes are of great interest. An alternative to LiPON is amorphous lithium borosilicate. Amorphous lithium borosilicate materials with ionic conductivity comparable to LiPON have been produced, but by methods requiring rapid quenching (Tatsumisago, M.; Machida, N.; Minami, T., Mixed Anion Effect in Conductivity of Rapidly Quenched $Li_4SiO_4$—$Li_3BO_3$ Glasses. *Yogyo-Kyokai-Shi* 1987, 95, (2), 197-201). This synthetic method gives rise to irregular 'splats' of glass, which are not suitable for processing into thin film batteries. Synthesis by sputtering of similar compositions has been attempted in thin films, but these were not successful, resulting in materials with significantly reduced conductivities when compared to the rapidly quenched glass (Machida, N.; Tatsumisago, M.; Minami, T., Preparation of amorphous films in the systems $Li_2O_2$—$SiO_2$ and $Li_2O$—$B_2O_{3-Si}O_2$ by RF-sputtering and their ionic conductivity. *Yogyo-Kyokai-Shi* 1987, 95, (1), 135-7).

Lithium ion conducting glasses, such as those from the $Li_2O$—$B_2O_3$—$SiO_2$ system, have also been produced by the sol-gel route (Satyanarayana, N.; Muralidharan, P.; Patcheammalle, R.; Venkateswarlu, M.; and Rama Rao, G. V., Investigation of sol-gel route in the synthesis of lithium ion conducting glasses. *Solid State Ionics* 1996, 86-88, 543-546). However, high sintering temperatures are required, which are generally considered unsuitable for thin film battery manufacture as they may damage underlying battery layers. Furthermore, it is desirable for the electrolytes of thin film batteries to have a low thickness of, for example, 15 μm or less. This is considered difficult to achieve through the sol gel route.

Many different thin film deposition methods have been proposed to date, which suffer from a range of drawbacks. Synthetic routes to thin films, which are generally referred to using the umbrella term of 'physical vapour deposition' include pulsed laser deposition, flash evaporation, sputtering and thermal evaporation, the most widespread method being sputtering. In this method a target of a particular composition is sputtered using plasma formed over the target; the resulting vapour condenses on a substrate, thereby forming the thin film. Sputtering involves the deposition of materials directly from a target. The product of the sputter varies and may include dimers, trimers or higher order particles.

An alternative is thermal evaporation directly from the elements, but this is uncommon. Julien and Nazri (Julien, C. M.; Nazri, G. A., Chapter 4. Materials for electrolyte: Thin Films. In *Solid State Batteries: Materials Design and Optimization*, 1994) allude to an attempt to synthesize $B_2O_3$-$xLi_2O$-$yLi_nX$ (X=I, Cl, $SO_4$ and n=1,2) directly from the elements, but no results are reported and the authors comment that "the difficulties in implementing this technique stay in enhancing the oxygen pumping, avoiding the high oxygen reactivity with the heated parts of the system, and making available an oxygen monoatomic source in order to enhance oxygen reactions on the surface".

Nevertheless, the present inventors have previously demonstrated the synthesis of phosphorus-containing materials directly from the constituent elements (WO 2013/011326; WO 2013/011327). However, a complexity in this process is the use of a cracker to break down phosphorus so as to enable the formation of phosphates. The synthesis of cathode (lithium iron phosphate—example 5, lithium manganese phosphate—example 7) and electrolyte materials ($Li_3PO_4$—example 1 and nitrogen doped $Li_3PO_4$—example 6) is disclosed. The deposited materials are amorphous; annealing is used to crystallise the cathode materials. Although this work demonstrates two of the three basic building blocks for producing a thin film cell, it does not demonstrate an operational cell. Furthermore, the ionic conductivities demonstrated in this work are too low to enable a cell to function correctly at room temperature.

The efforts required to overcome these many difficulties in the various deposition processes and the complexities involved in developing new materials mean that the vast majority of thin film batteries are limited to using LiPON as an electrolyte, deposited as a thin film by sputtering. Clearly, it is desirable to provide thin films of other electrolyte materials so that thin film battery technology can be developed and enhanced.

In particular, it is desirable to provide amorphous lithium borosilicate compositions having improved suitability for use as electrolytes in thin film batteries.

SUMMARY OF THE INVENTION

According to a first aspect of the invention, there is provided a vapour deposition method for preparing an amorphous lithium borosilicate or doped lithium borosilicate compound, the method comprising:

providing a vapour source of each component element of the compound, wherein the vapour sources comprise at least a source of lithium, a source of oxygen, a source of boron, and a source of silicon, and, optionally, a source of at least one dopant element;

delivering a flow of said lithium, said oxygen, said boron and said silicon, and, optionally, said dopant element; and co-depositing the component elements from the vapour sources onto a substrate wherein the component elements react on the substrate to form the amorphous compound;

wherein the amorphous lithium borosilicate or doped lithium borosilicate compound has a lithium content in the range 40-65 atomic %, based on the combined atomic percentages of lithium, boron and silicon.

According to a second aspect of the invention, there is provided a composition comprising an amorphous lithium borosilicate or doped lithium borosilicate compound, wherein the composition is obtained or obtainable by depositing the amorphous compound on a substrate using a vapour deposition method according to the first aspect of the invention.

According to a third aspect of the invention, there is provided a method of making a surface-modified electrode by a vapour deposition process, the electrode comprising an electrode active material, wherein a surface of said electrode is modified by an amorphous lithium borosilicate or doped lithium borosilicate compound, wherein the method comprises:

(a) providing a vapour source of each component element of the amorphous compound, wherein the vapour sources comprise at least a source of lithium, a source of oxygen, a source of boron and a source of silicon, and, optionally, a source of at least one dopant element;

(b) providing an electrode;

(c) delivering a flow of said lithium, said oxygen, said boron and said silicon, and, optionally, said dopant element; and (d) co-depositing the component elements from the vapour sources onto the electrode, wherein the component elements react on the electrode to form the amorphous compound;

wherein the amorphous lithium borosilicate or doped lithium borosilicate compound has a lithium content in the range 40-65 atomic %, based on the combined atomic percentages of lithium, boron and silicon.

According to a fourth aspect of the invention, there is provided a surface-modified electrode obtained or obtainable by a method according to the third aspect of the invention.

According to a fifth aspect of the invention, there is provided a battery comprising:

an electrolyte;

a negative electrode; and a positive electrode;

wherein at least one of the negative electrode or positive electrode is a surface-modified electrode, wherein the surface-modified electrode is according to the fourth aspect of the invention.

According to a sixth aspect of the invention, there is provided a method of making a battery, the method comprising depositing an electrolyte of the battery as a layer of an amorphous lithium borosilicate or doped lithium borosilicate compound using a vapour deposition method according to the first aspect of the invention.

According to a seventh aspect of the invention, there is provided a battery comprising:

a positive electrode;

a negative electrode; and an electrolyte;

wherein the electrolyte is in the form of a layer of an amorphous lithium borosilicate or doped lithium borosilicate compound deposited on a substrate using a vapour deposition method according to the first aspect of the invention.

For ease of reference, the above and further aspects of the invention are now discussed under appropriate section headings. However, the teachings under each section are not necessarily limited to each particular section.

BRIEF DESCRIPTION OF THE DRAWINGS

Embodiments of the invention will now be described, by way of example only, with reference to accompanying drawings, in which.

DETAILED DESCRIPTION

Definitions

Figure 1:
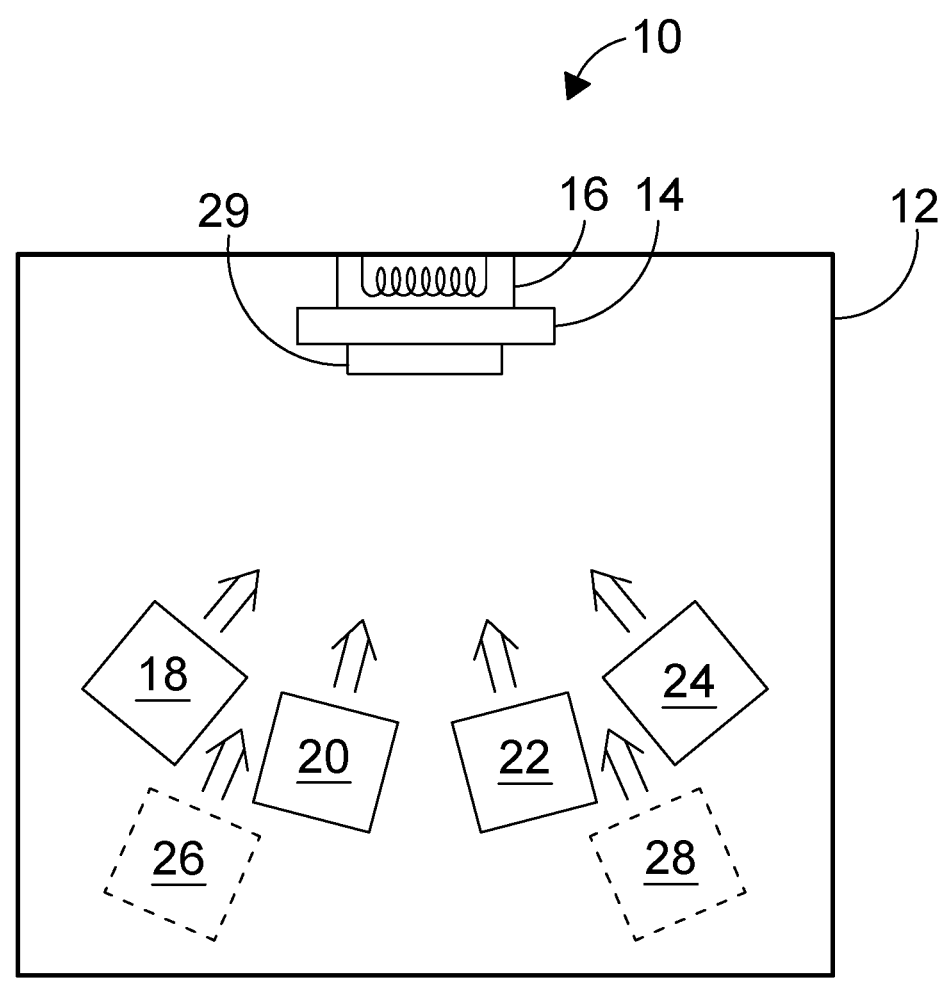
FIG. 1 shows a schematic representation of an example apparatus suitable for implementing a method according to embodiments of the invention.

As used herein, ranges of values set forth herein as "X to Y" or "between X and Y" are inclusive of the end values X and Y.

As used herein, the term "battery" is taken to be synonymous with the term "cell", and is a device capable of either generating electrical energy from chemical reactions or facilitating chemical reactions through the introduction of electrical energy.

Method

In a first aspect, the present invention provides a method for preparing an amorphous lithium borosilicate (LiBSiO) or doped lithium borosilicate compound. As described herein, the method is a vapour deposition method. The method comprises:

providing a vapour source of each component element of the compound, wherein the vapour sources comprise at least a source of lithium, a source of oxygen, a source of boron, and a source of silicon, and, optionally, a source of at least one dopant element;

delivering a flow of said lithium, said oxygen, said boron and said silicon, and, optionally, said dopant element; and co-depositing the component elements from the vapour sources onto a substrate wherein the component elements react on the substrate to form the amorphous compound;

wherein the amorphous lithium borosilicate or doped lithium borosilicate compound has a lithium content in the range 40-65 atomic %, based on the combined atomic percentages of lithium, boron and silicon.

It is conventionally thought that lithium borosilicate compounds or doped lithium borosilicate compounds need to contain high levels of lithium (typically over 70 atomic %, based on the combined atomic percentages of lithium, boron and silicon) in order to provide acceptable levels of ionic conductivity. Intuitively, the skilled person would expect a reduction in the level of lithium to result in a reduced concentration of lithium ions available to migrate within the lithium borosilicate compound or the doped lithium borosilicate compound. However, it has surprisingly been found that while lithium borosilicate compounds deposited through vapour deposition methods exhibit a general trend of decreasing ionic conductivity with decreasing lithium content, a region of anomalously high ionic conductivity is observed for lithium borosilicate compounds having a lithium content in the range 40-65 atomic %, based on the combined atomic percentages of lithium, boron and silicon.

Lithium borosilicate compounds having a lithium content within this range surprisingly exhibit higher levels of ionic conductivity relative to certain lithium borosilicate compounds having higher lithium contents, these levels of ionic conductivity typically being of the order of $1 \times 10^{-7}$ S/cm or more. These levels of ionic conductivity are typically considered to be acceptable in electrolyte applications. The surprising finding that acceptable levels of ionic conductivity may be provided by lithium borosilicate compounds having relatively low lithium contents has the consequence that lithium borosilicate compounds may be provided for use as electrolytes having one or both of the following additional properties:

increased chemical stability (it is thought that the tendency of lithium borosilicate to form $Li_2CO_3$ when exposed to an ambient atmosphere decreases with decreasing lithium content); and/or increased thermal stability (it is thought that the crystallisation temperature of lithium borosilicate increases with decreasing lithium content: crystallisation of lithium borosilicate is undesirable as it is known to result in a significant drop in ionic conductivity relative to the amorphous phase)

Thus, the method according to the first aspect of the invention may provide the general benefits of a method of vapour deposition from the constituent elements (for example, the deposition of smooth, high-quality films, with good compositional control) along with the provision of a lithium borosilicate or doped lithium borosilicate compound having acceptable levels of ionic conductivity and increased chemical and/or thermal stability.

In the context of this disclosure and in relation to all aspects of the invention, the term "element" means "element of the periodic table". The lithium borosilicate compounds formed according to the invention therefore comprise component elements including lithium (Li) and oxygen (O). Also included are glass-forming elements, which include at least boron (B) and silicon (Si). In addition, dopant elements may also optionally be included. These may include, for example, nitrogen (N), sulfur (S), phosphorus (P), germanium (Ge), aluminium (Al), arsenic (As), titanium (Ti), aluminium (Al), zirconium (Zr), lead (Pb), gallium (Ga), tin (Sn), indium (In), bismuth (Bi), tungsten (W), niobium (Nb), tantalum (Ta), vanadium (V) and antimony (Sb) or combinations thereof. Other component elements will depend on the particular compound being formed, but in all cases each element in the compound is provided separately in the form of a vapour (or combined into a mixed vapour or plasma if appropriate), and each vapour is deposited onto a common substrate.

Also in the context of this disclosure and in relation to all aspects of the invention, the term "amorphous lithium borosilicate compound" means "an amorphous compound containing lithium, oxygen, boron and silicon", and the term "amorphous doped lithium borosilicate compound" means "a compound containing lithium, oxygen, boron, silicon and one or more other dopant elements", where "a compound" is "a substance or material formed by the combination of two or more elements in fixed or substantially fixed proportions by a chemical reaction" (it being understood that in many cases, the elements are not present within the compound in precisely stoichiometric proportions). For the avoidance of doubt, the expression "an amorphous lithium borosilicate or doped lithium borosilicate compound" means "an amorphous lithium borosilicate compound or an amorphous doped lithium borosilicate compound".

In the context of this disclosure and in relation to all aspects of the invention, the term "amorphous" means "a solid that is not crystalline", i.e. that has no long range order in its lattice. It has been found that, according to the methods of the present invention, a desired compound can be deposited in amorphous form if one or more of the component elements from which the compound is deposited is a glass-forming element. Boron (B) and silicon (Si) are glass-forming elements that are included in lithium borosilicate compounds (and doped lithium borosilicate compounds). Other examples of glass-forming elements that may be included as dopant elements in the compounds include germanium (Ge), aluminium (Al), arsenic (As), titanium (Ti), aluminium (Al), zirconium (Zr), tungsten (W), niobium (Nb), tantalum (Ta), vanadium (V) and antimony (Sb) (Varshneya, A. K., *Fundamentals of Inorganic Glasses*, Academic Press, page 33).

Therefore, in some embodiments, the vapour sources comprise at least a source of lithium, at least a source of oxygen, at least a source of boron and at least a source of silicon. In some embodiments, the vapour sources may further comprise a source or sources of one or more of the following dopant elements: nitrogen, germanium, aluminium, arsenic, titanium, aluminium, zirconium, tungsten, niobium, tantalum, vanadium and antimony. As described herein in relation to all aspects of the invention, the sources of boron and silicon are sources of glass-forming elements.

In certain cases, the amorphous lithium borosilicate or doped lithium borosilicate compound has a lithium content in the range 45-65 atomic %, based on the combined atomic percentages of lithium, boron and silicon. In certain cases, the amorphous lithium borosilicate or doped lithium borosilicate compound has a lithium content in the range 50-65 atomic %, based on the combined atomic percentages of lithium, boron and silicon. In certain cases, the amorphous lithium borosilicate or doped lithium borosilicate compound has a lithium content in the range 50-60 atomic %, based on the combined atomic percentages of lithium, boron and silicon.

In certain cases, the lithium borosilicate compound or doped lithium borosilicate compound has a lithium content of 64 atomic % or less, based on the combined atomic percentages of lithium, boron and silicon. In certain cases, the lithium borosilicate compound or doped lithium borosilicate compound has a lithium content of 63 atomic % or less, based on the combined atomic percentages of lithium, boron and silicon. In certain cases, the lithium borosilicate compound or doped lithium borosilicate compound has a lithium content of 62 atomic % or less, based on the combined atomic percentages of lithium, boron and silicon. In certain cases, the lithium borosilicate compound or doped lithium borosilicate compound has a lithium content of 61 atomic % or less, based on the combined atomic percentages of lithium, boron and silicon. In certain cases, the lithium borosilicate compound or doped lithium borosilicate compound has a lithium content of 60 atomic % or less, based on the combined atomic percentages of lithium, boron and silicon.

In certain cases, the lithium borosilicate compound or doped lithium borosilicate compound has a lithium content of at least 45 atomic %, based on the combined atomic percentages of lithium, boron and silicon. In certain cases, the lithium borosilicate compound or doped lithium borosilicate compound has a lithium content of at least 46 atomic %, based on the combined atomic percentages of lithium, boron and silicon. In certain cases, the lithium borosilicate compound or doped lithium borosilicate compound has a lithium content of at least 47 atomic %, based on the combined atomic percentages of lithium, boron and silicon. In certain cases, the lithium borosilicate compound or doped lithium borosilicate compound has a lithium content of at least 48 atomic %, based on the combined atomic percentages of lithium, boron and silicon. In certain cases, the lithium borosilicate compound or doped lithium borosilicate compound has a lithium content of at least 49 atomic %, based on the combined atomic percentages of lithium, boron and silicon. In certain cases, the lithium borosilicate compound or doped lithium borosilicate compound has a lithium content of at least 50 atomic %, based on the combined atomic percentages of lithium, boron and silicon.

Typically, the lithium borosilicate compound or doped lithium borosilicate compound has a boron content in the range 1-50 atomic %, based on the combined atomic percentages of lithium, boron and silicon. In certain cases, the lithium borosilicate compound or doped lithium borosilicate compound has a boron content in the range 15-45 atomic %, based on the combined atomic percentages of lithium, boron and silicon. In certain cases, the lithium borosilicate compound or doped lithium borosilicate compound has a boron content in the range 15-40 atomic %, based on the combined atomic percentages of lithium, boron and silicon. In certain cases, the lithium borosilicate compound or doped lithium borosilicate compound has a boron content in the range 20-40 atomic %, based on the combined atomic percentages of lithium, boron and silicon.

In certain cases, the lithium borosilicate compound or doped lithium borosilicate compound has a boron content of at least 10 atomic %, based on the combined atomic percentages of lithium, boron and silicon. In certain cases, the lithium borosilicate compound or doped lithium borosilicate compound has a boron content of at least 11 atomic %, based on the combined atomic percentages of lithium, boron and silicon. In certain cases, the lithium borosilicate compound or doped lithium borosilicate compound has a boron content of at least 12 atomic %, based on the combined atomic percentages of lithium, boron and silicon. In certain cases, the lithium borosilicate compound or doped lithium borosilicate compound has a boron content of at least 13 atomic %, based on the combined atomic percentages of lithium, boron and silicon. In certain cases, the lithium borosilicate compound or doped lithium borosilicate compound has a boron content of at least 14 atomic %, based on the combined atomic percentages of lithium, boron and silicon. In certain cases, the lithium borosilicate compound or doped lithium borosilicate compound has a boron content of at least 15 atomic %, based on the combined atomic percentages of lithium, boron and silicon.

In certain cases, the lithium borosilicate compound or doped lithium borosilicate compound has a boron content of 49 atomic % or less, based on the combined atomic percentages of lithium, boron and silicon. In certain cases, the lithium borosilicate compound or doped lithium borosilicate compound has a boron content of 48 atomic % or less, based on the combined atomic percentages of lithium, boron and silicon. In certain cases, the lithium borosilicate compound or doped lithium borosilicate compound has a boron content of 47 atomic % or less, based on the combined atomic percentages of lithium, boron and silicon. In certain cases, the lithium borosilicate compound or doped lithium borosilicate compound has a boron content of 46 atomic % or less, based on the combined atomic percentages of lithium, boron and silicon. In certain cases, the lithium borosilicate compound or doped lithium borosilicate compound has a boron content of 45 atomic % or less, based on the combined atomic percentages of lithium, boron and silicon.

Typically, the lithium borosilicate compound or doped lithium borosilicate compound has a silicon content in the range 1-30 atomic %, based on the combined atomic percentages of lithium, boron and silicon. In certain cases, the lithium borosilicate compound or doped lithium borosilicate compound has a silicon content in the range 8-25 atomic %, based on the combined atomic percentages of lithium, boron and silicon. In certain cases, the lithium borosilicate compound or doped lithium borosilicate compound has a silicon content in the range 10-25 atomic %, based on the combined atomic percentages of lithium, boron and silicon.

In certain cases, the lithium borosilicate compound or doped lithium borosilicate compound has a silicon content of at least 5 atomic %, based on the combined atomic percentages of lithium, boron and silicon. In certain cases, the lithium borosilicate compound or doped lithium borosilicate compound has a silicon content of at least 6 atomic %, based on the combined atomic percentages of lithium, boron and silicon. In certain cases, the lithium borosilicate compound or doped lithium borosilicate compound has a silicon content of at least 7 atomic %, based on the combined atomic percentages of lithium, boron and silicon. In certain cases, the lithium borosilicate compound or doped lithium borosilicate compound has a silicon content of at least 8 atomic %, based on the combined atomic percentages of lithium, boron and silicon.

In certain cases, the lithium borosilicate compound or doped lithium borosilicate compound has a silicon content of 29 atomic % or less, based on the combined atomic percentages of lithium, boron and silicon. In certain cases, the lithium borosilicate compound or doped lithium borosilicate compound has a silicon content of 28 atomic % or less, based on the combined atomic percentages of lithium, boron and silicon. In certain cases, the lithium borosilicate compound or doped lithium borosilicate compound has a silicon content of 27 atomic % or less, based on the combined atomic percentages of lithium, boron and silicon. In certain cases, the lithium borosilicate compound or doped lithium borosilicate compound has a silicon content of 26 atomic % or less, based on the combined atomic percentages of lithium, boron and silicon. In certain cases, the lithium borosilicate compound or doped lithium borosilicate compound has a silicon content of 25 atomic % or less, based on the combined atomic percentages of lithium, boron and silicon.

In certain cases, the lithium borosilicate compound consists essentially of a system of lithium oxide in combination with silicon oxide and/or boron oxide.

In this regard, the term "consisting essentially of a system of lithium oxide in combination with silicon oxide and/or boron oxide" means that the total amount of lithium, boron and silicon atoms in the lithium borosilicate material, expressed as a molar percentage of the total amount of atoms other than oxygen in the material, is at least 90%, preferably at least 95%, preferably at least 97%, more preferably at least 98%, even more preferably at least 99%, still more preferably at least 99.5%, even more preferably at least 99.7%, still more preferably at least 99.8%, even more preferably at least 99.9%, still more preferably at least 99.95%, even more preferably at least 99.97%, still more preferably at least 99.98%, even more preferably at least 99.99%, still more preferably at least 99.995%, even more preferably at least 99.997%, still more preferably at least 99.998%, even more preferably at least 99.999%, still more preferably at least 99.9995%, even more preferably at least 99.9997%, still more preferably at least 99.9998%, even more preferably at least 99.9999%, and most preferably 100%.

In certain cases, the lithium borosilicate compound consists essentially of a system of lithium oxide in combination with silicon oxide and boron oxide.

In certain cases, the lithium borosilicate compound consists essentially of a ternary system of lithium oxide in combination with silicon oxide and boron oxide.

In certain cases, the composition of the lithium borosilicate compound or doped lithium borosilicate compound lies in the region bounded by 64 atomic % Li-26 atomic % B-10 atomic % Si; 63 atomic % Li-21 atomic % B-16 atomic % Si; 59 atomic % Li-18 atomic % B-23 atomic % Si; 51 atomic % Li-32 atomic % B-17 atomic % Si; 46 atomic % Li-42 atomic % B-12 atomic % Si; and 52 atomic % Li-38 atomic % B-10 atomic % Si; wherein the atomic percentages of each of lithium, boron and silicon are based on the combined percentages of lithium, boron and silicon.

In certain cases, the composition of the lithium borosilicate compound or doped lithium borosilicate compound lies in the region bounded by 64 atomic % Li-26 atomic % B-10 atomic % Si; 63 atomic % Li-21 atomic % B-16 atomic % Si; 50 atomic % Li-39 atomic % B-11 atomic % Si; 46 atomic % Li-42 atomic % B-12 atomic % Si; 51 atomic % Li-32 atomic % B-17 atomic % Si; and 59 atomic % Li-18 atomic % B-23 atomic % Si; wherein the atomic percentages of each of lithium, boron and silicon are based on the combined percentages of lithium, boron and silicon.

In certain cases, the composition of the lithium borosilicate compound or doped lithium borosilicate compound lies in the region bounded by 64 atomic % Li-26 atomic % B-10 atomic % Si; 63 atomic % Li-21 atomic % B-16 atomic % Si; 59 atomic % Li-18 atomic % B-23 atomic % Si; 53 atomic % Li-32 atomic % B-15 atomic % Si; and 52 atomic % Li-38 atomic % B-10 atomic % Si; wherein the atomic percentages of each of lithium, boron and silicon are based on the combined percentages of lithium, boron and silicon.

In certain cases, the composition of the lithium borosilicate compound or doped lithium borosilicate compound lies in the region bounded by 64 atomic % Li-26 atomic % B-10 atomic % Si; 63 atomic % Li-21 atomic % B-16 atomic % Si; 59 atomic % Li-18 atomic % B-23 atomic % Si; 56 atomic % Li-32 atomic % B-12 atomic % Si; and 51 atomic % Li-32 atomic % B-17 atomic % Si; wherein the atomic percentages of each of lithium, boron and silicon are based on the combined percentages of lithium, boron and silicon.

In certain cases, the composition of the lithium borosilicate compound or doped lithium borosilicate compound lies in the region bounded by 60 atomic % Li-27 atomic % B-13 atomic % Si; 59 atomic % Li-18 atomic % B-23 atomic % Si; 56 atomic % Li-32 atomic % B-12 atomic % Si; and 51 atomic % Li-32 atomic % B-17 atomic % Si; wherein the atomic percentages of each of lithium, boron and silicon are based on the combined percentages of lithium, boron and silicon.

In certain cases, the composition of the lithium borosilicate compound or doped lithium borosilicate compound lies in the region bounded by 60 atomic % Li-27 atomic % B-13 atomic % Si; 60 atomic % Li-25 atomic % B-15 atomic % Si; 59 atomic % Li-22 atomic % B-19 atomic % Si; 56 atomic % Li-32 atomic % B-12 atomic % Si; and 53 atomic % Li-32 atomic % B-15 atomic % Si; wherein the atomic percentages of each of lithium, boron and silicon are based on the combined percentages of lithium, boron and silicon.

It will be appreciated that small amounts of other atoms may be present in the lithium borosilicate material as described herein. In such embodiments, the compound may be described as a doped lithium borosilicate compound. Such other atoms may be present in the compound provided that such amounts of other atoms do not affect the properties of the lithium borosilicate material. Such traces of other atoms may substitute for any of Li, B, O and/or Si, preferably for B and/or Si.

Typical examples of atoms (dopants) which may substitute for Li, B, O and/or Si (preferably for B and/or Si) in the structure of the lithium borosilicate material include N, S, Ge, Al, P, Ti, V, Zr, Pb, Ga, As, Sn, In, Sb, Bi, Nb, Ta and W. Preferred examples of atoms which may substitute for Li, B, O and/or Si (preferably for B and/or Si) in the structure of the lithium borosilicate material include Al, Ti, Ge, P, V, W, S and N. In some embodiments, the dopant element is nitrogen, and the amorphous compound is nitrogen-doped lithium borosilicate.

Typically, the dopant element or elements are present in an amount no greater than 10 at % percent, relative to the combined percentages of lithium, boron, and silicon. In certain cases, the dopant element or elements are present in an amount no greater than 8 at % percent, relative to the combined percentages of lithium, boron, and silicon. In certain cases, the dopant element or elements are present in an amount no greater than 5 at % percent, relative to the combined percentages of lithium, boron, and silicon. It is thought that the presence of certain dopant elements may assist in increasing the crystallisation temperature of the lithium borosilicate material, while maintaining acceptable levels of ionic conductivity. Thus, it is preferred that the amount and type of dopant element does not significantly impact the proportion of those structural units of the lithium borosilicate compound that are thought to promote the mobility of lithium (that is, structural units selected from the group consisting of: orthoborate, pyrosilicate, orthosilicate, and pyroborate). Effectively, it is preferred that the amount and type of the dopant element does not have a significant effect on the Raman spectrum of the lithium borosilicate compound, as discussed below in relation to the second aspect of the invention.

For the avoidance of doubt, where the amount of an element is specified based on the combined atomic percentages of lithium, boron and silicon or relative to the combined percentages of lithium, boron and silicon, this means that the amount of that element is expressed as a proportion of the total content of lithium, boron and silicon.

In certain cases, the lithium borosilicate compound and/or the doped lithium borosilicate compound does not contain phosphorus.

Typically, the lithium borosilicate compound and/or the doped lithium borosilicate compound is a glass.

It has been found that the lithium borosilicate glass as described herein exhibits high ionic conductivity while also exhibiting lower electronic conductivity. It has also been found that the lithium borosilicate glass as described herein is particularly stable in contact with lithium. These improved properties make the lithium borosilicate glass composition particularly suitable as a protectant for electrodes, particularly on the anode of a battery including the composition as a coating on the anode.

In certain embodiments according to the first aspect of the invention, the vapour source of oxygen may be a vapour source of atomic oxygen or molecular oxygen. In the case that the vapour source of oxygen is a vapour source of atomic oxygen, the vapour source of oxygen may comprise an ozone source and/or a plasma source.

In general, the use of atomic oxygen is preferred to molecular oxygen, as it is thought that the higher reactivity of atomic oxygen results in increased deposition rates and/or greater uniformity of the deposited compound across the substrate.

Preferably, the vapour source of oxygen is a vapour source of atomic oxygen that comprises a plasma source.

In the case that the vapour source of oxygen is a vapour source of atomic oxygen comprising a plasma source, the flow rate of the oxygen may be at least about $8 \times 10^{-8}$ m$^3$/s, for example at least $1 \times 10^{-7}$ m$^3$/s, for example from about $1.25 \times 10^{-7}$ m$^3$/s to about $2 \times 10^{-7}$ m$^3$/s. This is particularly preferred in the case that the substrate temperature is below 180° C. (a deposition temperature below 180° C. may allow the method of the first aspect of the invention to be utilised for preparing materials in which the amorphous compound is deposited on lithium. This affords the potential for the composition prepared to be utilised not only as an electrolyte in a battery, but also as a protectant for electrodes, particularly on the anode of a battery (such as, for example, an anode comprising lithium as the negative electrode material). This also means that the composition prepared may be particularly suitable as an electrolyte in contact with lithium metal in a lithium ion battery). The rate of flow of the oxygen corresponds to the rate at which molecular oxygen is supplied to the plasma source.

In certain cases, the substrate is provided at a temperature of 160° C. or above, for example, 180° C. or above. If the substrate temperature is 180° C. or above, the flow rate of the oxygen is thought to be less critical, and may be in the range $1 \times 10^{-9}$ m$^3$/s to $1 \times 10^{-6}$ m$^3$/s. Similarly, if the vapour source of oxygen is a source of molecular oxygen, the flow rate of the oxygen is thought to be less critical, and may be in the range $1 \times 10^{-9}$ m$^3$/s to $1 \times 10^{-6}$ m$^3$/s.

The upper limit on substrate temperature is the temperature at which crystallisation, and a concurrent decrease in ionic conductivity, would occur. It is thought that high substrate temperatures may also result in loss of lithium (although, because of the use of separate sources for component elements of the amorphous compound, it may be possible to compensate for this by source adjustment). In general, it is preferred that the substrate temperature should be 400° C. or less. In certain cases, the substrate temperature may be 375° C. or less. In certain cases, the substrate temperature may be 350° C. or less.

The rate of flow of the other vapour sources, such as the source of lithium, source of boron and source of silicon, may be the same as or different to the rate of flow of the oxygen. As the skilled person will appreciate, the rate of flow of the vapour sources other than oxygen may affect the film composition and structure. At too high a rate of the other sources, the concentration of Li, B, Si will exceed the availability of oxygen and in the extreme the film would no longer be an oxide. In some embodiments, the rate of flow of lithium is from about $0.9 \times 10^{-10}$ m/s to about $10 \times 10^{-10}$ m/s, such as from about $2.5 \times 10^{-10}$ m/s to about $3.5 \times 10^{-10}$ m/s. In some embodiments, the rate of flow of boron is from about $0.01 \times 10^{-10}$ m/s to about $1.5 \times 10^{-10}$ m/s, such as from about $0.1 \times 10^{-10}$ m/s to about $0.2 \times 10^{-10}$ m/s. In some embodiments, the rate of flow of silicon is from about $0.01 \times 10^{-10}$ m/s to about $1.5 \times 10^{-10}$ m/s, such as from about $0.3 \times 10^{-10}$ m/s to about $0.4 \times 10^{-10}$ m/s.

In certain cases, the substrate comprises a surface layer that is supported on a bulk substrate element. The surface layer may provide a cathode for a thin film battery, while the lithium borosilicate layer may provide an electrolyte for a thin film battery.

FIG. 1 shows a schematic representation of an example apparatus 10 suitable for implementing an embodiment method of the first aspect of the invention. The deposition may preferably be carried out within a vacuum system 12, which may be an ultrahigh vacuum system. A substrate 14 of a desired material (depending on the intended purpose of the deposited amorphous compound) is mounted within the vacuum system 12. As heater 16 is provided to heat the substrate to the desired temperature.

Also within the system (preferably a vacuum or high vacuum system) are a plurality of vapour sources, one source for each of the component elements in the desired thin film compound. A first vapour source 18 comprises a source of oxygen, such as an oxygen plasma source. A second vapour source 20 comprises a source of lithium vapour. A third vapour source 22 comprises a source of vapour of glass-forming element boron. A fourth vapour source 24 comprises a source of vapour of glass-forming element silicon. Any number of other vapour sources (such as 26, 28, shown in phantom) may optionally be included depending on the number of elements comprised in the compound material of interest. For example, if the compound is nitrogen-doped lithium borosilicate, one of the vapour sources may be a source of nitrogen. Alternatively, in a case where oxygen is provided from a plasma source, the nitrogen may be introduced though the plasma source to create a mixed nitrogen-oxygen plasma.

The nature of each vapour source will depend on the element it delivers, and also the amount of control required over the rate of delivery (i.e. flow rate or flux). A source may be a plasma source, for example, particularly in the case of the oxygen vapour source. A plasma source delivers plasma-phase oxygen, i.e. a flux of oxygen atoms, radicals and/or ions. The source may be a radio frequency (RF) plasma source, for example. Atomic oxygen is advantageous when depositing compounds that comprise elements in high oxidation states. Oxygen may alternatively be provided using an ozone source. A plasma source such as an RF plasma source may also be used to deliver the nitrogen component vapour, if a nitrogen-doped lithium borosilicate compound is to be formed.

Electron beam evaporators and Knudsen cells (K-Cells) are other examples of vapour sources; these are well-suited for materials with low partial pressures. In both cases the material is held in a crucible and heated to generate a flux of material. A Knudsen cell uses a series of heating filaments around the crucible, whereas in an electron beam evaporator the heating is achieved by using magnets to direct a beam of high energy electrons onto the material.

Other example vapour sources are effusion cells and cracking sources. Embodiments of the invention eliminate any need for cracking, however, and thereby avoid the complexity inherent in the use of such sources. Further alternative vapour sources will be evident to the skilled person.

During the deposition process, a controlled flow rate or flux of each component element is released from its respective vapour source 18-28 onto the heated substrate 14, whereupon the various elements are co-deposited.

The elements then react on the substrate 14 to form a thin film layer 29 of the amorphous lithium borosilicate or doped lithium borosilicate compound.

In some embodiments, co-depositing the component elements onto the substrate comprises co-depositing the component elements directly onto a surface of the substrate. In some embodiments, co-depositing the component elements onto the substrate comprises co-depositing the component elements onto one or more layers supported on the substrate.

In some embodiments, the substrate is coated with a layer of the amorphous compound as described herein. In some embodiments, the amorphous compound entirely coats the surface of the substrate. In some embodiments, the amorphous compound partially covers the surface of the substrate.

In some embodiments, the substrate is or comprises lithium. In some embodiments, the substrate comprises lithium. In some embodiments, the substrate consists essentially of lithium. In some embodiments, the substrate consists of lithium.

The reaction of the component elements to form the compound preferably occurs on the surface of the substrate rather than in the vapour phase prior to deposition on the substrate. While not wishing to be bound by theory, it is believed that each component element in the vapour form collides with and adheres to the surface of the substrate, where the atoms of each element are then mobile on the surface and so are able to react with each other to form the amorphous compound.

The process is preferably carried out in a high vacuum. As the skilled person understands, the term "high vacuum" refers to a pressure of from $1 \times 10^{-7}$ Torr to $1 \times 10^{-2}$ Torr ($1.33 \times 10^{-5}$ Pa to 1.33 Pa). In some embodiments, the total pressure of the chamber is less than about $1 \times 10^{-1}$ Pa, such as less than about $5 \times 10^{-2}$ Pa, such as less than about $1 \times 10^{-2}$ Pa, such as less than about $5 \times 10^{-3}$ Pa, such as less than about $1 \times 10^{-3}$ Pa. Performing the process in a partial vacuum ensures that the mean free path of the vapour phase particles (mean distance travelled before collision with another particle) travelling in the vacuum from their respective sources is long so that the chance of collisions between particles prior to deposition on the substrate is minimised. Advantageously, therefore, the distance from the sources to the substrate may be arranged to be less than the mean free path to increase the chance of the particles reaching the substrate without colliding, thereby avoiding vapour phase interactions. Reaction of the component elements may hence be limited to the substrate surface and the quality of the thin film compound material is enhanced.

A significant advantage of the invention according to the first aspect is that deposition of the constituents of the compound directly from the elements allows for direct control of the compound composition via the rates of deposition of the component elements. The rate of flow or flux of each element can be independently controlled by appropriate operation of its respective vapour source so that the chemical composition of the deposited compound can be tailored according to exacting requirements if desired. Direct control of the stoichiometry of the deposited compound is therefore possible by controlling the flux, and hence consequently the rate of deposition, of each component element. Conventional deposition techniques such as sputtering and pulsed laser deposition can suffer from preferential loss of lighter elements so control of the proportion of the elements in the final compound is more difficult.

Also, deposition directly from the component elements eliminates the need for sputtering targets or precursors, and additional elements can be incorporated directly with no requirement to prepare new deposition targets. Further, it enables the deposition of smooth dense films with undamaged surfaces. Vapour sources such as those exemplified above produce lower energy particles than those produced by sputtering; this lower energy prevents cluster formation and reduces surface roughness of the deposited thin film, which is also a problem with pulsed laser deposition.

Importantly, the invention according to the first aspect allows the formation of amorphous lithium-containing compounds. The amorphous nature makes the compounds suitable for use as electrolytes in thin film batteries. Under conventional synthetic conditions for both bulk and thin film samples, these compounds are known to crystallise which impairs their performance as electrolytes. The present invention is thus beneficial in offering a technique for making lithium-based thin film electrolytes.

Composition

In a second aspect, the present invention may provide a composition comprising an amorphous lithium borosilicate or doped lithium borosilicate compound, wherein the composition is obtained or obtainable by depositing the amorphous compound on a substrate using a vapour deposition method, the method comprising:

providing a vapour source of each component element of the compound, wherein the vapour sources comprise at least a source of lithium, a source of oxygen, a source of boron, and a source of silicon, and, optionally, a source of at least one dopant element;

delivering a flow of said lithium, said oxygen, said boron and said silicon, and, optionally, said dopant element; and co-depositing the component elements from the vapour sources onto a substrate wherein the component elements react on the substrate to form the amorphous compound;

wherein the amorphous lithium borosilicate or doped lithium borosilicate compound has a lithium content in the range 40-65 atomic %, based on the combined atomic percentages of lithium, boron and silicon.

The vapour deposition method may include one or more of the features of the method according to the first aspect of the invention.

In some embodiments, the amorphous compound has an ionic conductivity of at least about $1 \times 10^{-7}$ S/cm as measured at 25° C., such as at least about $5 \times 10^{-7}$ S/cm as measured at 25° C., such as at least about $1 \times 10^{-6}$ S/cm as measured at 25° C., such as at least about $1 \times 10^{-6}$ S/cm at 25° C., such as at least about $1.1 \times 10^{-6}$ S/cm at 25° C., such as at least about $1.2 \times 10^{-6}$ S/cm at 25° C., such as at least about $1.3 \times 10^{-6}$ S/cm at 25° C. In certain cases, the amorphous compound has an ionic conductivity of at least about $3 \times 10^{-6}$ S/cm at 25° C.

Preferably, the compound has a crystallisation temperature of at least 350° C., preferably 380° C., more preferably 400° C.

Typically, the compound has a Raman spectrum comprising one or more bands selected from the group consisting of: $839 \pm 25$ cm$^{-1}$; $868 \pm 25$ cm$^{-1}$; $918 \pm 25$ cm$^{-1}$; and $943 \pm 25$ cm$^{-1}$. These bands are thought to indicate the presence of the following structural units within the lithium borosilicate or doped lithium borosilicate compound:

TABLE 1

| Band | Structural unit |
| --- | --- |
| $943 \pm 25$ cm$^{-1}$ | Orthoborate |
| $918 \pm 25$ cm$^{-1}$ | Pyrosilicate |
| $868 \pm 25$ cm$^{-1}$ | Orthosilicate |
| $839 \pm 25$ cm$^{-1}$ | Pyroborate |

The structural units listed in Table 1 are thought to promote the mobility of lithium within the lithium borosilicate or doped lithium borosilicate compound.

Preferably, the lithium borosilicate or doped lithium borosilicate compound contains a low proportion of those structural units that are not considered to promote the mobility of lithium within the compound. Example of such structural units are listed in Table 2, along with the corresponding Raman band:

TABLE 2

| Band | Structural unit |
| --- | --- |
| 782 cm$^{-1}$ | 6-membered borate ring with $BO_4$ units |
| 720 cm$^{-1}$ | Metaborate chain |
| 666 cm$^{-1}$ | Si—O—Si chain |

For example, in the case that the compound has a Raman spectrum comprising a band at $943 \pm 25$ cm$^{-1}$, it is preferred that the intensity of the band at $943 \pm 25$ cm$^{-1}$ is at least 1.5 times, preferably at least 2 times greater than the intensity of the spectrum at 782 cm$^{-1}$.

The lithium borosilicate compound or doped lithium borosilicate compound may be as described hereinabove in respect of the first aspect of the invention.

Preferably, the amorphous compound is lithium borosilicate. The lithium borosilicate composition may be as described hereinabove in respect of the first aspect of the invention.

In some embodiments, the amorphous compound is lithium borosilicate or nitrogen-doped lithium borosilicate.

In some embodiments, the amorphous compound does not comprise phosphorus.

Preferably, the amorphous compound has a low electronic conductivity. In some embodiments, the amorphous compound has an electronic conductivity that is less than about $1 \times 10^{-12}$ S/cm as measured at 25° C., such as less than about $2 \times 10^{-13}$ S/cm as measured at 25° C., such as less than about $1 \times 10^{-13}$ S/cm as measured at 25° C., such as less than about $8 \times 10^{-14}$ S/cm as measured at 25° C.

In some embodiments, the amorphous compound is a thin film. In some embodiments, the thin film is between 40 nm and 15,000 nm in thickness, such as between 50 nm and 10,000 nm, such as between 100 nm and 5,000 nm, such as between 200 nm and 4,000 nm, such as between 300 nm and 3,000 nm.

Method of Making Electrode

In a third aspect, the present invention may provide a method of making a surface-modified electrode by a vapour deposition process, the electrode comprising an electrode active material, wherein a surface of said electrode is modified by an amorphous lithium borosilicate or doped lithium borosilicate compound, wherein the method comprises:

(a) providing a vapour source of each component element of the amorphous compound, wherein the vapour sources comprise at least a source of lithium, a source of oxygen, a source of boron and a source of silicon, and, optionally, a source of at least one dopant element;

(b) providing an electrode;

(c) delivering a flow of said lithium, said oxygen, said boron and said silicon, and, optionally, said dopant element; and (d) co-depositing the component elements from the vapour sources onto the electrode, wherein the component elements react on the electrode to form the amorphous compound;

wherein the amorphous lithium borosilicate or doped lithium borosilicate compound has a lithium content in the range 40-65 atomic %, based on the combined atomic percentages of lithium, boron and silicon.

The method of the third aspect of the invention may comprise one or more of the optional features of the method of the first aspect of the invention.

As used herein, the term "surface-modified" and "a surface of which is modified by" means that at least a portion of a surface of the electrode is in mechanical or chemical contact with the amorphous compound described herein.

In some embodiments of the third aspect of the invention, the step (b) of providing an electrode comprises:

providing first separate vapour sources for each component element of the electrode; and co-depositing the component elements from their separate vapour sources onto a substrate wherein the component elements react on the substrate to form an electrode.

Alternatively, the step (b) of providing an electrode may comprise preparation of the electrode by either thick or thin film processes. These may include, but are not restricted to, physical vapour deposition, chemical vapour deposition, doctor blade casting, tape casting, screen printing, stencil printing, ink jet printing, transfer printing, flexographic printing, spray printing, Gravure printing, Offset printing, and/or Rotary screen printing, whereby the electrode is either a monolith of the electrode active material or a composite comprising electrode active material(s), binder(s), electronic additives, ionic additives which individually or in combination with one another are compatible with the boundary temperature and pressure conditions described herein for the synthesis of the solid state electrolyte materials at low temperatures. The binder materials may comprise organic or inorganic materials (or mixtures thereof) which are compatible with the aforementioned process conditions and have been used to produce thick or thin film composite electrodes independent of or on top of an electrically conductive current collector.

In one embodiment of the third aspect of the invention, the method is a method of making a surface-modified negative electrode. In one embodiment of the third aspect of the invention, the method is a method of making a surface-modified positive electrode. In one embodiment of the third aspect of the invention, the method is a method of making a LiBSiO-surface-modified negative electrode. In another embodiment of the third aspect of the invention, the method is a method of making a LiBSiO-surface-modified positive electrode. In one embodiment of the third aspect of the invention, the LiBSiO coating is produced by the physical vapour deposition as described herein.

The electrode active material of the electrode is not particularly limited as long as the material allows the amorphous lithium borosilicate or doped lithium borosilicate compound to attach a surface thereto, and is capable of storing and releasing lithium ions. In some embodiments of the third aspect of the invention, the surface-modified electrode is a surface-modified negative electrode. Negative electrode active materials may be selected from $Li_4Ti_5O_{12}$, Li, Si, Ge, Sn, Sb, Al, Mg, Bi, Si-M (M=Mg, Al, Sn, Zn, Ag, Fe, Ni, Mn), InSb, metal oxides including: $TiO_2$, vanadium and molybdenum oxides, Ti, Nb oxides ($MgTi_2O_5$, $TiNb_2O_7$), SnO, $SnO_2$, Sb oxides or germanates.

The negative electrode active material used in the battery of the present invention (or in an embodiment of the third aspect of the invention) may be lithium or a lithiated transition metal oxide, such as lithium titanium oxide. The negative electrode active material may be a lithium metal alloy, including LiSi, LiSb or LiGe. The negative electrode active material may also be a carbon-containing material (such as activated carbon) capable of reversibly intercalating lithium ions, a tin containing material, a silicon-containing material, or other material.

Negative electrode active materials further include graphite, synthetic graphite, coke, fullerenes, niobium pentoxide, tin alloys, silicon (including amorphous silicon), titanium oxide, tin oxide, and lithium titanium oxide.

Negative electrode active materials comprising elemental carbon materials include graphite, synthetic graphite, coke, fullerenes, carbon nanotubes, other graphitic carbon and combinations thereof. Graphitic carbon refers to any elemental carbon material comprising substantial domains of graphene sheets.

In one embodiment of the third aspect of the invention, the electrode is provided at a temperature of less than about 180° C., and the negative electrode active material comprises lithium metal, or an alloy thereof. In a further embodiment of the third aspect of the invention, the electrode is provided at a temperature of less than about 180° C., and the negative electrode may comprise a layer of lithium metal, or a lithium-aluminium alloy. In another embodiment of the third aspect of the invention, the electrode is provided at a temperature of less than about 180° C., and the negative electrode is lithium. In another embodiment of the third aspect of the invention, the electrode is provided at a temperature of less than about 180° C., and the negative electrode is a lithium free anode. In another embodiment of the third aspect of the invention, the electrode is provided at a temperature of less than about 180° C., and the negative electrode is a lithium air anode. In some embodiments of the third aspect of the invention, the electrode is provided at a temperature of less than about 180° C., and the negative electrode is lithium.

In some embodiments of the third aspect of the invention, the electrode is a lithium intercalation electrode. As used herein, the term "intercalation" refers to the reversible inclusion or insertion of a molecule or ion into compounds with layered structures. Therefore, a lithium intercalation electrode may be an electrode in which lithium ions may be reversibly included or inserted into a layered structure, e.g. graphite.

In some embodiments of the third aspect of the invention, the surface-modified electrode is a surface-modified positive electrode. A positive electrode active material may include a lithiated transition metal compound, such as a lithium nickel manganese oxide, lithium nickel vanadium oxide, lithium cobalt vanadium oxide, or lithium cobalt phosphate, for example $Li_2NiMn_3O_8$, $LiNiVO_4$, $LiCoVO_4$, $LiCoPO_4$, and the like. Other examples include lithium nickel phosphate, lithium nickel fluorophosphate, and lithium cobalt fluorophosphate; i.e. $LiNiPO_4$, $Li_2NiPO_4F$, $Li_2CoPO_4F$, and the like. The lithium content typically varies depending on the state of charge of the battery. The positive active material may comprise other oxygen-containing materials, such as an oxide, manganate, nickelate, vanadate, phosphate, or fluorophosphate. The positive active material may have the formula $Li_xM_yN_zO$, where M is selected from a group consisting of Ni, Mn, V, and Co, and N is a heteroatomic species different from M, such as Ni, Mn, V, Co, or P. N can be omitted. The positive active material may also be fluorinated, for example as a fluorophosphate.

In one embodiment, the positive electrode active material of a battery of the present invention (or of an electrode provided in an embodiment of the third aspect of the invention) is selected from the group consisting of $LiCoO_2$, $FeS_2$, $LiCoPO_4$, $LiFePO_4$, $Li_2FeS_2$, $Li_2FeSiO_4$, $LiMn_2O_4$, $LiMnPO_4$, $LiNiPO_4$, $LiV_3O_8$, $LiV_6O_{13}$, $LiVOPO_4$, $LiVOPO_4F$, $Li_3V_2(PO_4)_3$, $MnO_2$, $MoS_3$, S, $TiS_2$, $TiS_3$, $V_2O_5$, $V_6O_{13}$, $LiNi_{0.5}Mn_{1.5}O_4$, and $LiMnNiCoAlO_2$.

In another embodiment, the positive electrode active material of a battery of the present invention (or of an electrode provided in an embodiment of the third aspect of the invention) is high voltage positive electrode active materials. In a further embodiment, the high voltage positive electrode active material is selected from the group consisting of $LiCoPO_4$, $LiNi_{0.5}Mn_{1.5}O_4$, $LiMnPO_4$, $LiMn_2O_4$, $LiCoO_2$, $LiNi_{1/3}Mn_{1/3}Co_{1/3}O_2$, $LiFePO_4$, $LiNiPO_4$, $Li_2NiPO_4F$, $Li_2CoPO_4F$, $LiMnPO_4F$, $Li_2CoSiO_4$, $Li_2MnSiO_4$, $FeF_3$, $LiMn_{0.8}Fe_{0.1}Ni0.1PO_4$, $Li_{1-x}VOPO_4$ and $Li_2FePO_4F$.

In some embodiments, the electrode comprises a positive electrode active material selected from the group consisting of $LiCoPO_4$, $LiNi_{0.5}Mn_{1.5}O_4$, $LiMnPO_4$, $LiCoO_2$, $LiNi_{1/3}Mn_{1/3}Co_{1/3}O_2$, $LiFePO_4$, $LiNiPO_4$, $Li_2NiPO_4F$, $Li_2CoPO_4F$, $LiMnPO_4F$, $Li_2CoSiO_4$, $Li_2MnSiO_4$, $FeF_3$, $LiMn_{0.8}Fe_{0.1}Ni_{0.1}PO_4$, $Li_{1-x}VOPO_4$, and $Li_2FePO_4F$.

The amorphous lithium borosilicate or doped lithium borosilicate compound may be any compound as described hereinabove with respect to the first aspect of the invention. In some embodiments of the third aspect of the invention, the amorphous compound is lithium borosilicate. In some embodiments of the third aspect of the invention, the amorphous compound is nitrogen-doped lithium borosilicate.

In some embodiments of the third aspect of the invention, the amorphous lithium borosilicate compound or doped lithium borosilicate compound is provided as a layer on the surface of the electrode. In some embodiments of the third aspect of the invention, the amorphous compound is deposited onto one or more layers supported on the substrate layered structure, e.g. graphite.

In some embodiments of the third aspect of the invention, the electrode is coated with a layer of the amorphous compound as described herein (such as LiBSiO). In some embodiments of the third aspect of the invention, the amorphous compound described herein (such as LiBSiO) is provided as a layer on the surface of the electrode.

In some embodiments of the third aspect of the invention, a surface of the electrode is coated with a layer of the amorphous compound (such as LiBSiO) as described herein. This coating may be achieved by first casting an electrode comprising electrode active material (and optionally carbon additive, polymer binder and/or solvent) on a current collector, and then curing and drying the electrode. The surface of the cast electrode may then have a protective layer of the amorphous compound (such as LiBSiO) deposited thereon. In some embodiments of the third aspect of the invention, the amorphous compound (such as LiBSiO) entirely coats the surface of the electrode. In some embodiments of the third aspect of the invention, the amorphous compound (such as LiBSiO) partially covers the surface of the electrode.

In some preferred embodiments of the third aspect of the invention, the electrode is provided at a temperature of less than about 180° C., and the amorphous compound is lithium borosilicate, and the electrode comprises lithium.

Electrode

Also described herein is an electrode that has been surface-modified. The electrode is surface-modified using a method according to the third aspect of the invention.

The electrode comprises an electrode active material, wherein a surface of said electrode is modified by an amorphous lithium borosilicate compound or doped lithium borosilicate compound as described herein. In some preferred embodiments, a surface of said electrode is modified by a lithium borosilicate compound. The LiBSiO-surface-modified electrode may have improved stability and/or improved cycling over an unmodified electrode, particularly although not exclusively when operated in the presence of an adjacent liquid phase electrolyte material.

In some embodiments, the amorphous compound (such as LiBSiO) is deposited as a layer on the electrode material. As a result, the electrode may be coated with a layer of the amorphous compound. In some embodiments, the amorphous compound entirely coats the surface of the electrode. In some embodiments, the amorphous compound partially covers the surface of the electrode.

In some embodiments, the electrode comprises a negative electrode active material. The negative electrode material may be as described hereinabove in relation to the third aspect of the invention. In some embodiments, the electrode comprises a positive electrode active material. The positive electrode active material may be as described hereinabove in relation to the third aspect of the invention.

In some preferred embodiments, the electrode is surface-modified at a temperature of less than 180° C. and the amorphous compound is lithium borosilicate, and the electrode comprises lithium.

Method of Making Battery

A further aspect of the invention provides for a method of making a battery. The method comprises depositing an electrolyte of the battery as a layer of an amorphous lithium borosilicate compound or doped lithium borosilicate compound using a vapour deposition method according to the first aspect described hereinabove.

In some embodiments, the battery is a thin film battery. The thin film battery may be produced by sequentially forming films of constituents in all-solid state.

Battery—Surface of Negative and/or Positive Electrode Modified by Amorphous Compound One aspect of the invention relates to a battery comprising a positive electrode, a negative electrode, and an electrolyte between said positive electrode and said negative electrode, wherein at least one of the negative electrode or positive electrode is a surface-modified electrode, wherein the surface-modified electrode is as described herein.

In some embodiments, a surface of at least one of the negative electrode or positive electrode is modified by an amorphous lithium borosilicate compound or doped lithium borosilicate compound as described herein.

In some preferred embodiments, the amorphous compound does not comprise phosphorus. In some preferred embodiments, the amorphous compound is lithium borosilicate. In some embodiments, it is preferred that the lithium borosilicate composition consists essentially of a system of lithium oxide in combination with silicon oxide and boron oxide, wherein said lithium borosilicate comprises between 40-65 atomic % lithium based on the combined atomic percentages of lithium, boron and silicon, and wherein said lithium borosilicate is a glass. In one embodiment, the battery comprises a LiBSiO-surface-modified negative electrode.

In one embodiment, the battery comprises a positive electrode, a negative electrode, and an electrolyte between said positive electrode and said negative electrode, wherein the negative electrode is coated with a layer of an amorphous compound as described herein (such as LiBSiO). In one embodiment, the battery comprises a positive electrode, a negative electrode, and an electrolyte between said positive electrode and said negative electrode, wherein the positive electrode is coated with a layer of an amorphous compound as described herein (such as LiBSiO).

In one embodiment, the invention provides a battery comprising a positive current collector, a positive electrode comprising a positive electrode active material, an electrolyte, a negative electrode comprising a negative electrode active material, and a negative current collector, wherein a surface of at least one of the negative electrode or positive electrode is modified by an amorphous compound (such as LiBSiO) as described herein. In one embodiment, the battery comprises a LiBSiO-surface-modified negative electrode. In one embodiment, the battery comprises a LiBSiO-surface-modified positive electrode.

Both the positive electrode (cathode) and negative electrode (anode) may be surface-modified by an amorphous compound (such as LiBSiO) as described herein. For example, in another embodiment, the battery comprises a LiBSiO-surface-modified negative electrode and a LiBSiO-surface-modified positive electrode.

In a further embodiment, the battery is a lithium ion secondary battery. In another embodiment, the lithium ion secondary battery is a thin-film battery.

In one embodiment, the invention provides a battery comprising a positive current collector, a positive electrode comprising a positive electrode active material, an electrolyte, a negative electrode comprising a negative electrode active material, and a negative current collector, wherein the negative electrode is coated with an amorphous compound (such as LiBSiO) of the present invention, e.g., one prepared by a method according to the first aspect of the invention. In one embodiment, the battery comprises a LiBSiO-coated negative electrode. In another embodiment, the battery comprises a LiBSiO-coated negative electrode and a LiBSiO-coated positive electrode.

The electrolyte may comprise an organic electrolyte, liquid electrolyte, an ionic liquid, a gel electrolyte, room temperature molten salt, or a solid electrolyte. If the electrolyte is a liquid or gel, then preferably it is a non-aqueous electrolyte. In one embodiment, the electrolyte is an organic electrolyte. In another embodiment, the electrolyte is a liquid electrolyte. In a further embodiment, the liquid electrolyte is a non-aqueous electrolyte. In another embodiment, the electrolyte is a gel electrolyte. In another embodiment, the electrolyte is a molten salt electrolyte. In another embodiment, the electrolyte is a solid electrolyte.

In a further embodiment the liquid, non-aqueous electrolyte comprises a lithium salt and a non-aqueous solvent. Examples of lithium salts include $LiPF_6$, $LiBF_4$, lithium bis(trifluoromethanesulfonyl)amide (LiTFSA, LiN $(CF_3SO_2)_2$), $LiCF_3SO_3$, $LiC_4F_9SO_3$, $LiC(CF_3SO_2)_3$, $LiClO_4$, lithium bis(oxalato)borate (LiBOB), lithium bis(trifluoromethanesulfonyl)imide (LiTFSI), lithium bis(fluorosulfonyl)amide (LiFSA, $LiN(SO_2F)_2$), and $LiCF_3CO_2$. The non-aqueous solvent is capable of dissolving the lithium salt. Examples of the non-aqueous solvent include propylene carbonate, ethylene carbonate, diethyl carbonate, dimethyl carbonate, ethyl methyl carbonate, 1,2-dimethoxyethane, 1,2-diethoxyethane, acetonitrile, propionitrile, tetrahydrofuran, 2-methyltetrahydrofuran, dioxane, 1,3-dioxolane, nitromethane, N,N-dimethyl formamide, dimethyl sulfoxide, sulfolane, vinylene carbonate, and γ-butyrolactone.

In some embodiments, the electrolyte comprises an additive. The electrolyte additive may modify the electrode-electrolyte interface easily and economically. In some embodiment, the electrolyte comprises an additive selected from the group consisting of 4-(trifluoromethyl)-1,3-dioxolan-2-one (TFM-EC), tris(hexafluoro-iso-propyl)phosphate (HFip), 3-hexylthiophene, LiDFOB, tris(trimethylsilyl) phosphate (TMSP), tris(trimethylsilyl)borate (TMSB), and combinations thereof.

Battery—Electrolyte in Form of Layer of Amorphous Lithium Borosilicate Compound or Doped Lithium Borosilicate Compound A further aspect of the invention provides a battery, wherein the battery comprises:
    a positive electrode;
    a negative electrode; and
    an electrolyte;
    wherein the electrolyte is in the form of a layer of an amorphous lithium borosilicate compound or doped lithium borosilicate compound deposited on a substrate using a vapour deposition method according to the first aspect of the invention described hereinabove.

In some embodiments, the negative electrode comprises lithium. In some embodiments, the positive electrode comprises lithium. In some embodiments, the positive electrode comprises a positive electrode active material selected from the group consisting of $LiCoPO_4$, $LiNi_{0.5}Mn_{1.5}O_4$, $LiMnPO_4$, $LiCoO_2$, $LiNi_{1/3}Mn_{1/3}Co_{1/3}O_2$, $LiFePO_4$, $LiNiPO_4$, $Li_2NiPO_4F$, $Li_2CoPO_4F$, $LiMnPO_4F$, $Li_2CoSiO_4$, $Li_2MnSiO_4$, $FeF_3$, $LiMn_{0.8}Fe_{0.1}Ni_{0.1}PO_4$, $Li_{1-x}VOPO_4$, and $Li_2FePO_4F$.

In some preferred embodiments, the amorphous compound is lithium borosilicate. The amorphous compound may be as described hereinabove in relation to any aspect of the invention.

In some embodiments, the battery further comprises a positive electrode current collector and a negative electrode current collector. In a further embodiment, the battery further comprises a substrate. In a further embodiment, the battery is encapsulated.

In some embodiments, the battery is a lithium ion battery. In some embodiments, the battery is a lithium ion secondary battery. In some embodiments, the battery is a thin film battery comprising a positive electrode, an electrolyte and a negative electrode. In some embodiments, the battery is an all-solid state battery.

In some embodiments, the battery is an improved lithium ion battery comprising a negative electrode, a positive electrode, and an electrolyte comprising an amorphous compound (such as LiBSiO) as described herein in relation to any aspect of the invention, wherein the positive electrode comprises a high voltage positive active material having an electrochemical potential of at least 3.5 V versus Li/Li⁺; at least 4.0 V versus Li/Li⁺; at least 4.5 V versus Li/Li⁺; at least 5.5 V versus Li/Li⁺; or between 6.0-8.5 V versus Li/Li⁺.

A Li-ion battery with an amorphous compound electrolyte (such as LiBSiO electrolyte) as described herein in relation to any aspect of the invention and a high voltage positive electrode allows development of a high energy/power density Li-ion battery. Furthermore, the amorphous compounds obtained or obtainable according to the method as described herein may have very high ionic conductivity and low electrical conductivity, and so may provide improved performance, such as higher power and energy as well as stable low capacity. For high voltage operation, another significant aspect of the electrolyte properties is the reductive and oxidative stability. The improved reductive and oxidative stability improves cycling performance and life of the battery of the invention.

The negative electrode and positive electrode may be as described hereinabove.

Each of the ranges as described herein may be taken alone or combined with one or more other component ranges to provide a preferred aspect of the invention.

EXAMPLES

The invention will now be described with reference to the following non-limiting examples.
Experimental Methods and Materials
The ionic conductivities for a range of compositions in the LiBSiO system were measured as a function of lithium content (approximately 48-88 atomic % lithium, as based on the components Li, B and Si).

The crystallisation temperatures for a range of compositions in the LiBSiO system were also measured as a function of lithium content (approximately 47-82 atomic % lithium, as based on the components Li, B and Si).

Furthermore, Raman spectra for certain compositions were obtained.

In this experimental series, the lithium borosilicate material was formed from the component elements lithium, oxygen and two glass-forming elements, boron and silicon, using the method disclosed in WO2015/104540, entitled 'Vapour Deposition Method for Preparing Amorphous Lithium-Containing Compounds', incorporated herein by reference in its entirety. Lithium borosilicate was fabricated by providing a vapour source of each component element of the compound and co-depositing the component elements from the vapour sources onto a substrate heated to 225° C. at a pressure from $2.7 \times 10^{-3}$ to $4.3 \times 10^{-3}$ Pa ($2 \times 10^{-5}$ to $3.2 \times 10^{-5}$ Torr). The component elements reacted on the substrate to form the amorphous lithium borosilicate compound.

The deposition was carried out in a physical vapour deposition (PVD) system which was previously described in the literature (Guerin, S. and Hayden, B. E., Journal of Combinatorial Chemistry 8 (2006) 66-73). All samples were deposited utilizing an oxygen plasma source as a source of atomic oxygen (the plasma source converts $O_2$ (gas) into a flux of oxygen atoms, radicals and/or ions directed at the substrate). The oxide materials, lithium silicate and lithium borate, require the highest oxidation states of both silicon and boron (4+ and 3+ respectively), and the use of atomic oxygen rather than molecular oxygen therefore removes the dissociation step required to break $O_2$ to $2O$ and provides a highly reactive species to oxidize silicon and boron into their highest oxidation states, as required in the materials $Li_4SiO_4$ and $Li_3BO_3$. Lithium was deposited from a Knudsen cell source. Silicon and boron were both deposited from electron gun (E-Gun) sources.

The rate of deposition of the lithium was controlled by varying the temperature of the Knudsen source while those of the boron and silicon were controlled according to the power of the electron beam power supply. The rates of the sources were determined using quartz crystal microbalances placed directly beneath the substrate onto which the films were deposited.

The substrates used throughout were stainless steel substrates (type ss304). The substrates had the following composition: 9.25 wt % Ni, 19 wt % Cr, 1 wt % Si, 2 wt % Mn, 0.08 wt % C, 0.045 wt % P, 0.03 wt % S and 68.595 wt % Fe. The substrates had a thickness of 0.51 mm and a diameter of 15.85 mm.

The elemental compositions of samples were measured by Laser Ablation Inductively Coupled Plasma Mass Spectroscopy (ICP-MS) using a Perkin Elmer Elan 9000 ICP-MS equipped with a New Wave 213 nm laser. The ICP-MS analysis was done with reference to a pellet comprising NIST610 standard reference material.

The sample thicknesses were measured by ellipsometry (Woollam M-200FI Spectroscopic Ellipsometer). Using deposition times of 60 to 840 min, films were deposited with thicknesses ranging from 350 to 2688 nm.

Impedance measurements were carried out on the materials deposited in order to measure the ionic conductivity of the materials. Such impedance measurements were carried out using a Solartron 1260 Impedance Analyser. The solid state electrolyte was sandwiched between a stainless steel or platinum-coated substrate (bottom electrode) and platinum top electrode. The solid state electrolyte continuously covered the bottom electrode whilst discrete top platinum electrodes were deposited using RF sputtering. The impedance was measured using an AC excitation potential of 150 mV across a frequency range of 1 MHz to 0.01 Hz. The response at each frequency was determined using a five second integration time. Seven frequencies were measured per decade with logarithmic spacing between the upper and lower frequency limits.

The crystallisation temperature was measured by monitoring changes in reflectivity of the samples as a function of temperature in an inert atmosphere. This technique is based on the insight that crystallisation events (and other changes in the phase of a material) are usually linked to sudden changes in reflectivity. It is described, for example in Guerin, S.; Hayden H.; Hewak, D. W.; and Vian, C., Synthesis and Screening of Phase Change Chalcogenide Thin Film Materials for Data Storage, ACS Comb. Sci. 2017, 19, 478-491: this article describes the technique in relation to phase change memory materials, but it is also applicable to a range of other amorphous materials and glasses.

To measure crystallisation temperature, the sample was mounted on a copper block having two embedded cartridge heaters operated via a Eurotherm 3508 controller, and the assembly placed inside a sealed stainless steel chamber having a top window. The sample was held in an inert argon atmosphere and heated at a rate of 5° C./min. Uniform white lighting was provided by a halogen lamp and a light diffuser, and an off-axis CCD camera (Lumenera Infinity 2-1M) was used to record images of the sample at set time intervals of 12 s, thus providing one picture per degree change in temperature. Images of the sample were recorded during the heating process until a sudden increase in reflectivity was observed, denoting crystallisation.

Results: Ionic Conductivity

Figure 2A:
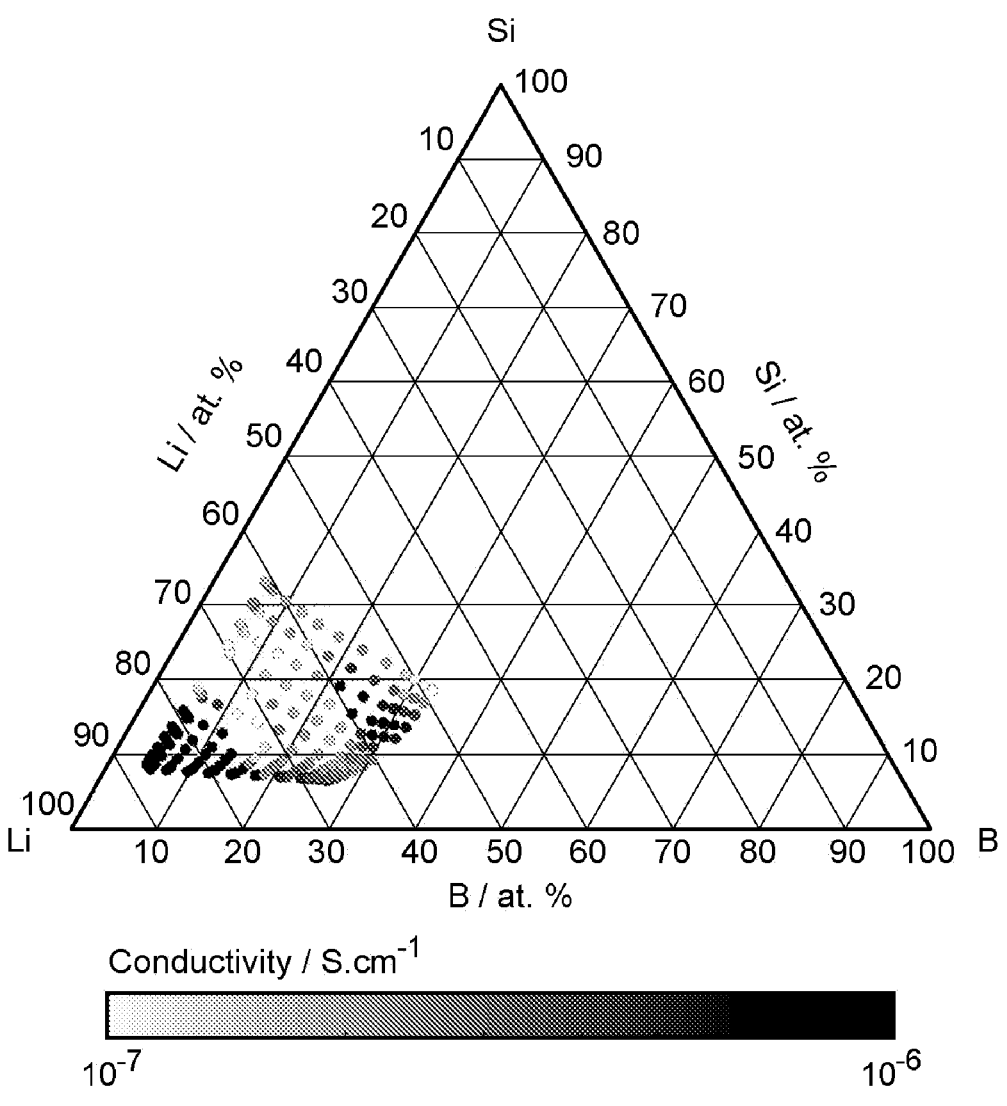
FIG. 2A shows a composition diagram for the lithium borosilicate system, in which the ionic conductivity of lithium borosilicate is given as a function of composition.
Figure 2B:
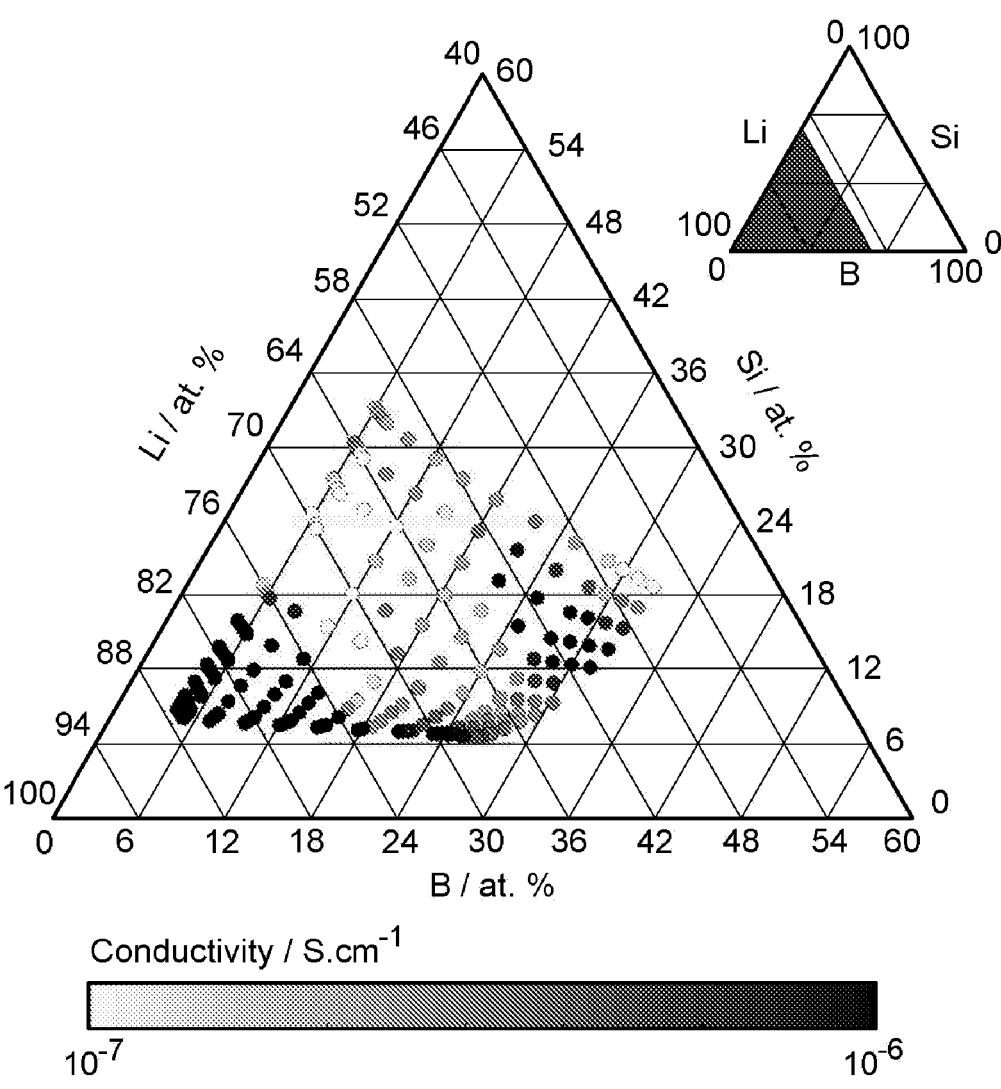
FIG. 2B shows a more detailed view of FIG. 2A.

FIGS. 2A and 2B show a ternary plot for the lithium borosilicate system, in which the ionic conductivity of lithium borosilicate is given as a function of composition (the ternary plot only shows the composition as a function of the amounts of lithium, boron and silicon present: oxygen is assumed to be present in the necessary amount for the maintenance of electroneutrality).

As is known from the prior art, lithium borosilicate containing high levels of lithium (for example, greater than 75 atomic %) exhibits high ionic conductivities of about $1 \times 10^{-6}$ S/cm or more. As the lithium content decreases from these levels, the ionic conductivity also exhibits a general downwards trend. However, surprisingly, in a compositional region around 45-65 atomic % lithium; 15-35 atomic % boron; and 10-25 atomic % silicon, anomalously high levels of ionic conductivity are observed, which counter the general trend of decreasing ionic conductivity with decreasing lithium content. Table 3 shows ionic conductivity values for specific compositions (given as at % based on the combined atomic percentages of lithium, silicon and boron) in the region of anomalously high ionic conductivity.

TABLE 3

| Composition (at %) | | | Ionic conductivity | Ionic conductivity (log10) |
|---|---|---|---|---|
| Li | Si | B | | |
| 63.76 | 17.90 | 18.34 | 1.380E−07 | −6.860 |
| 62.03 | 13.54 | 24.42 | 1.672E−07 | −6.777 |
| 62.01 | 11.17 | 26.82 | 1.957E−07 | −6.708 |
| 61.76 | 16.68 | 21.56 | 1.426E−07 | −6.846 |
| 61.23 | 20.53 | 18.24 | 1.862E−07 | −6.730 |
| 60.82 | 11.00 | 28.18 | 3.331E−07 | −6.477 |
| 60.04 | 12.75 | 27.21 | 4.252E−07 | −6.371 |
| 59.77 | 15.45 | 24.78 | 7.707E−07 | −6.113 |
| 59.64 | 10.82 | 29.54 | 4.088E−07 | −6.388 |
| 59.28 | 19.11 | 21.61 | 6.319E−07 | −6.199 |
| 58.83 | 12.52 | 28.64 | 7.321E−07 | −6.135 |
| 58.70 | 23.16 | 18.15 | 2.584E−07 | −6.588 |
| 57.98 | 14.45 | 27.57 | 7.545E−07 | −6.122 |
| 57.63 | 12.30 | 30.08 | 6.233E−07 | −6.205 |
| 57.32 | 17.70 | 24.98 | 6.350E−07 | −6.197 |
| 56.79 | 14.16 | 29.05 | 7.787E−07 | −6.109 |
| 56.79 | 21.55 | 21.66 | 4.697E−07 | −6.328 |
| 56.42 | 12.08 | 31.51 | 5.209E−07 | −6.283 |
| 55.60 | 13.86 | 30.54 | 6.936E−07 | −6.159 |
| 55.60 | 16.53 | 27.87 | 5.493E−07 | −6.260 |
| 54.88 | 19.95 | 25.17 | 3.777E−07 | −6.423 |
| 54.58 | 16.10 | 29.32 | 4.938E−07 | −6.306 |
| 54.42 | 13.56 | 32.02 | 5.777E−07 | −6.238 |
| 53.56 | 15.67 | 30.77 | 3.910E−07 | −6.408 |
| 53.23 | 18.61 | 28.16 | 3.041E−07 | −6.517 |
| 52.54 | 15.24 | 32.22 | 3.996E−07 | −6.398 |
| 52.43 | 22.21 | 25.37 | 1.859E−07 | −6.731 |
| 52.37 | 18.05 | 29.58 | 1.525E−07 | −6.817 |
| 51.51 | 17.48 | 31.00 | 2.429E−07 | −6.615 |
| 50.85 | 20.69 | 28.46 | 1.317E−07 | −6.880 |
| 50.66 | 16.92 | 32.42 | 2.079E−07 | −6.682 |
| 50.16 | 19.99 | 29.85 | 1.002E−07 | −6.999 |
| 49.47 | 19.30 | 31.23 | 9.861E−08 | −7.006 |
| 48.78 | 18.60 | 32.62 | 7.883E−08 | −7.103 |
| 64.10 | 10.20 | 25.80 | 1.275E−06 | −5.894 |
| 50.20 | 10.80 | 39.00 | 1.363E−07 | −6.865 |
| 45.70 | 12.00 | 42.30 | 1.064E−07 | −6.973 |
| 63.30 | 15.90 | 20.80 | 7.821E−07 | −6.107 |

Results: Crystallisation Temperature

Figure 3:
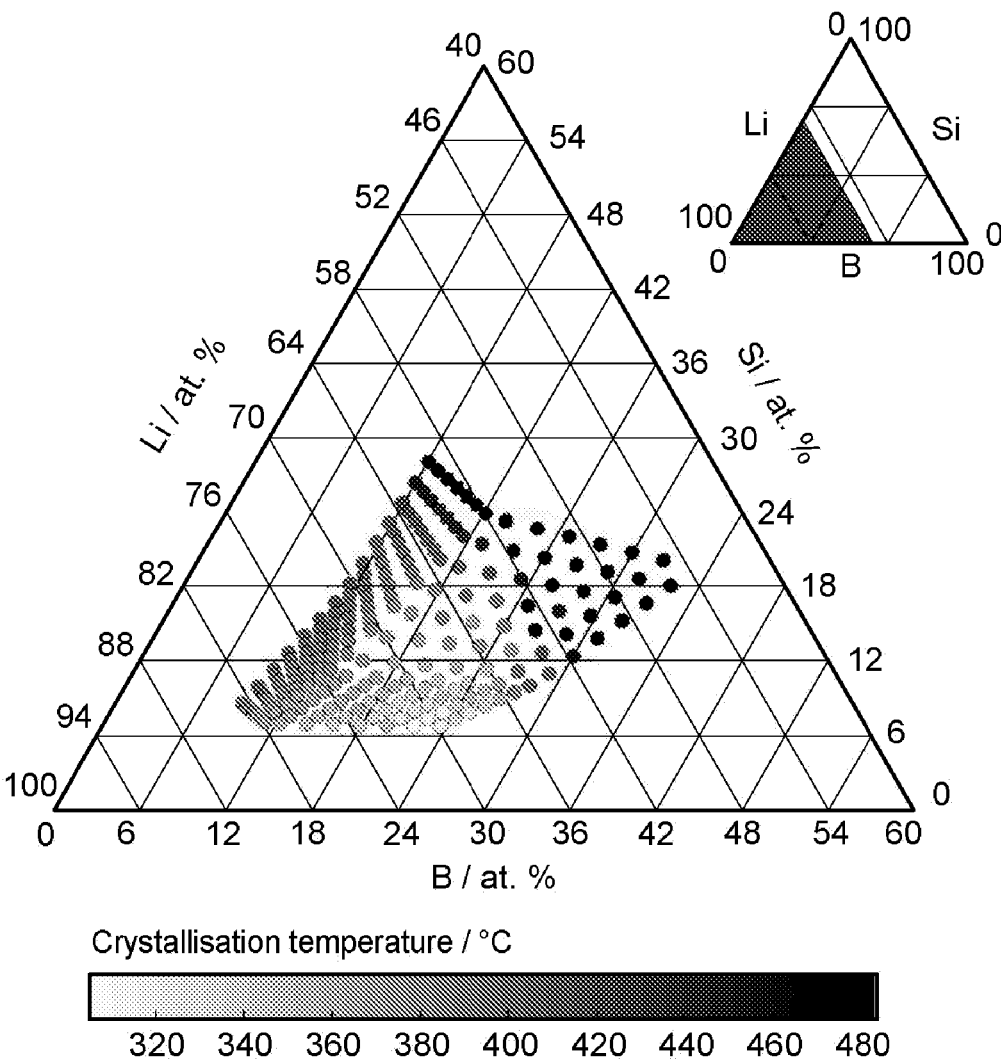
FIG. 3 shows a composition diagram for the lithium borosilicate system, in which the crystallisation temperature of lithium borosilicate is given as a function of composition

FIG. 3 shows a ternary plot for the lithium borosilicate system, in which the crystallisation temperature of lithium borosilicate is given as a function of composition (the ternary plot only shows the composition as a function of the amounts of lithium, boron and silicon present: oxygen is assumed to be present in the necessary amount for the maintenance of electroneutrality).

As may be seen from FIG. 3, there is a general trend of increasing crystallisation temperature with decreasing lithium content. Thus, for example, at lithium contents of about 70 atomic %, the crystallisation temperature is typically in the range 300-400° C., while at lithium contents of about 60 atomic % or below, the crystallisation temperature is generally above about 420° C.

The higher crystallisation temperatures observed at lower lithium contents are thought to provide a more thermally stable compound that is better able to withstand the temperatures experienced, for example, during the manufacture of solid state batteries. Crystallisation of lithium borosilicate compounds is generally undesirable as it is thought to result in a significant drop in ionic conductivity of the compound, thus reducing its suitability as an electrolyte or electrode surface-modifier.

Table 4 shows crystallisation temperature values for specific compositions.

TABLE 4

| Composition | | | Crystallisation temperature/ |
|---|---|---|---|
| Li | Si | B | ° C. |
| 82.4 | 8.0 | 9.6 | 366 |
| 81.9 | 7.0 | 11.1 | 355 |
| 80.9 | 9.2 | 10.0 | 381 |
| 80.8 | 7.7 | 11.5 | 354 |
| 79.5 | 9.4 | 11.1 | 365 |
| 79.2 | 11.2 | 9.6 | 378 |
| 78.4 | 9.7 | 11.9 | 363 |
| 77.8 | 11.4 | 10.8 | 373 |
| 77.4 | 12.6 | 10.0 | 382 |
| 76.8 | 8.1 | 15.1 | 346 |
| 76.2 | 12.6 | 11.2 | 377 |
| 75.7 | 8.7 | 15.6 | 349 |
| 75.4 | 6.7 | 17.9 | 331 |
| 74.7 | 13.7 | 11.6 | 377 |
| 74.3 | 14.5 | 11.2 | 384 |
| 73.7 | 8.6 | 17.7 | 336 |
| 73.3 | 12.5 | 14.1 | 365 |
| 72.6 | 15.8 | 11.6 | 387 |
| 72.3 | 10.6 | 17.1 | 349 |
| 71.7 | 8.5 | 19.7 | 328 |
| 71.0 | 7.9 | 21.1 | 324 |
| 70.4 | 11.8 | 17.8 | 348 |
| 70.2 | 10.5 | 19.3 | 341 |
| 69.8 | 8.5 | 21.8 | 323 |
| 69.1 | 7.8 | 23.1 | 310 |
| 68.5 | 7.2 | 24.4 | 329 |
| 68.0 | 17.2 | 14.8 | 369 |
| 67.5 | 18.9 | 13.6 | 373 |
| 67.1 | 7.7 | 25.1 | 318 |
| 66.3 | 11.4 | 22.3 | 347 |
| 65.6 | 18.3 | 16.1 | 366 |
| 65.3 | 15.4 | 19.3 | 365 |
| 65.1 | 23.2 | 11.7 | 386 |
| 63.9 | 10.1 | 26.0 | 352 |
| 63.2 | 15.1 | 21.7 | 351 |
| 63.1 | 21.7 | 15.1 | 386 |
| 62.1 | 11.1 | 26.8 | 376 |
| 61.6 | 26.5 | 11.9 | 421 |
| 61.0 | 24.3 | 14.7 | 409 |
| 60.5 | 22.1 | 17.5 | 408 |
| 59.6 | 12.6 | 27.8 | 389 |
| 59.2 | 26.8 | 14.0 | 445 |
| 58.2 | 24.7 | 17.1 | 442 |
| 57.5 | 20.9 | 21.6 | 431 |
| 56.2 | 18.1 | 25.8 | 459 |
| 54.7 | 15.6 | 29.7 | 452 |

TABLE 4-continued

| Composition | | | Crystallisation temperature/ |
| --- | --- | --- | --- |
| Li | Si | B | ° C. |
| 52.7 | 15.2 | 32.1 | 471 |
| 50.3 | 16.6 | 33.1 | 477 |
| 47.4 | 20.1 | 32.5 | 462 |

Results: Raman Spectroscopy

Figure 4:
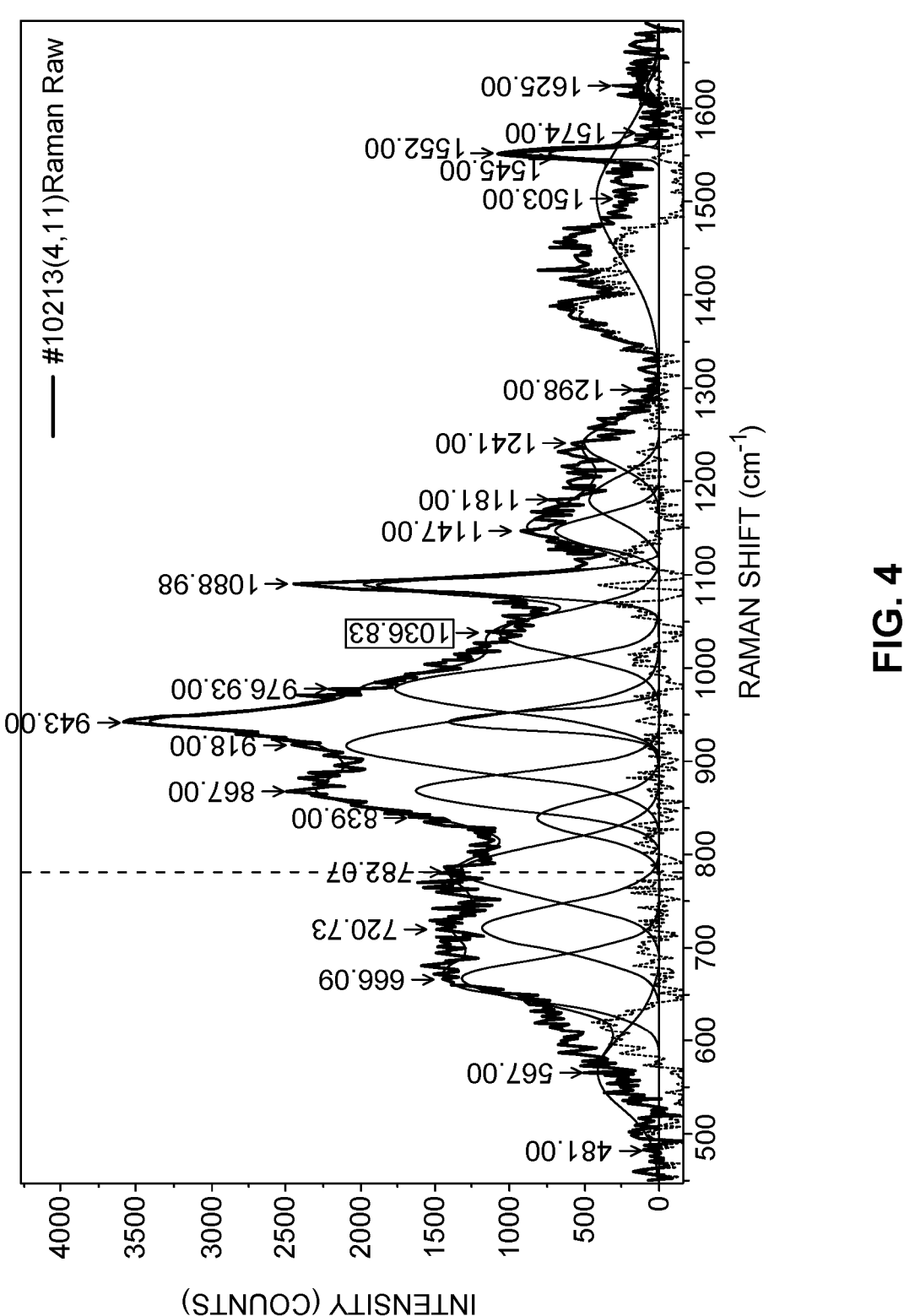
FIG. 4 shows the Raman spectrum obtained for lithium borosilicate comprising 57.98 at % lithium, 27.57 at % boron, and 14.45 at % silicon.

The Raman spectrum obtained for lithium borosilicate comprising 57.98 at % lithium, 27.57 at % boron, and 14.45 at % silicon (based on the combined atomic percentages of lithium, boron and silicon) is shown in FIG. 4.

The band at approximately 868 cm$^{-1}$ indicates the presence of an orthosilicate component, while that at approximately 943 cm$^{-1}$ indicates the presence of an orthoborate component. These structural units are thought to promote the mobility of lithium throughout the lithium borosilicate glass. By contrast, the intensity of the spectrum at approximately 782 cm$^{-1}$ is much lower, indicating a relatively low proportion of six-membered rings with $BO_4$ units in the lithium borosilicate glass. These structural units are not thought to promote the mobility of lithium to the same degree as the orthosilicate and orthoborate units.

All publications mentioned in the above specification are herein incorporated by reference. Various modifications and variations of the present invention will be apparent to those skilled in the art without departing from the scope and spirit of the invention. Although the invention has been described in connection with specific preferred embodiments, it should be understood that the invention as claimed should not be unduly limited to such specific embodiments. Indeed, various modifications of the described modes for carrying out the invention which are obvious to those skilled in chemistry, materials science or related fields are intended to be within the scope of the following claims.

The invention claimed is:

1. A vapour deposition method for preparing an amorphous lithium borosilicate or doped lithium borosilicate compound, the method comprising:

providing a vapour source of each component element of the compound, wherein the vapour sources comprise at least a source of lithium, a source of oxygen, a source of boron, and a source of silicon, and, optionally, a source of at least one dopant element;

delivering a flow of said lithium, said oxygen, said boron and said silicon, and, optionally, said dopant element; and co-depositing the component elements from the vapour sources onto a substrate wherein the component elements react on the substrate to form the amorphous compound;

wherein the amorphous lithium borosilicate or doped lithium borosilicate compound has a lithium content in the range 45-65 atomic %, a boron content in the range 15-35 atomic %, and a silicon content in the range 10-25 atomic %, based on the combined atomic percentages of lithium, boron and silicon.

2. The vapour deposition method according to claim 1, wherein the lithium borosilicate or doped lithium borosilicate compound has a lithium content of 63 atomic % or less, based on the combined atomic percentages of lithium, boron and silicon.

3. The vapour deposition method according to claim 2, wherein the lithium borosilicate or doped lithium borosilicate compound has a lithium content of 60 atomic % or less, based on the combined atomic percentages of lithium, boron and silicon.

4. The vapour deposition method according to claim 1, wherein the lithium borosilicate or doped lithium borosilicate compound has a lithium content of at least 50 atomic %, based on the combined atomic percentages of lithium, boron and silicon.

5. The vapour deposition method according to claim 1, wherein the amorphous compound is a lithium borosilicate compound that consists essentially of a system of lithium oxide in combination with silicon oxide and boron oxide.

6. The vapour deposition method according to claim 1, wherein the composition of the lithium borosilicate compound or doped lithium borosilicate compound lies in the region bounded by 64 atomic % Li-26 atomic % B-10 atomic % Si; 63 atomic % Li-21 atomic % B-16 atomic % Si; 59 atomic % Li-18 atomic % B-23 atomic % Si; 56 atomic % Li-32 atomic % B-12 atomic % Si; and 51 atomic % Li-32 atomic % B-17 atomic % Si; wherein the atomic percentages of each of lithium, boron and silicon are based on the combined percentages of lithium, boron and silicon.

7. The vapour deposition method according to claim 1, wherein the composition of the lithium borosilicate compound or doped lithium borosilicate compound lies in the region bounded by 60 atomic % Li-27 atomic % B-13 atomic % Si; 59 atomic % Li-18 atomic % B-23 atomic % Si; 56 atomic % Li-32 atomic % B-12 atomic % Si; and 51 atomic % Li-32 atomic % B-17 atomic % Si; wherein the atomic percentages of each of lithium, boron and silicon are based on the combined percentages of lithium, boron and silicon.

8. The vapour deposition method according to claim 1, wherein the composition of the lithium borosilicate compound or doped lithium borosilicate compound lies in the region bounded by 60 atomic % Li-27 atomic % B-13 atomic % Si; 60 atomic % Li-25 atomic % B-15 atomic % Si; 59 atomic % Li-22 atomic % B-19 atomic % Si; 56 atomic % Li-32 atomic % B-12 atomic % Si; and 53 atomic % Li-32 atomic % B-15 atomic % Si; wherein the atomic percentages of each of lithium, boron and silicon are based on the combined percentages of lithium, boron and silicon.

9. A composition comprising an amorphous lithium borosilicate or doped lithium borosilicate compound, wherein the composition is obtained by depositing the amorphous compound on a substrate using the vapour deposition method according to claim 1.

10. The composition according to claim 9, wherein the ionic conductivity of the compound is at least about 1×10–7 S/cm as measured at 25° C.

11. The composition according to claim 9, wherein the compound has a crystallisation temperature of at least 350° C.

12. The composition according to claim 11, wherein the compound has a Raman spectrum comprising one or more bands selected from the group consisting of: 839±25 cm−1; 868±25 cm−1; 918±25 cm−1; and 943±25 cm−1.

13. The composition according to claim 9, wherein the compound has a Raman spectrum comprising a band at 943±25 cm−1, and the intensity of the band at 943±25 cm−1 is at least 1.5 times, preferably at least 2 times greater than the intensity of the spectrum at 782 cm−1.

14. A method of making a surface-modified electrode by a vapour deposition process, the electrode comprising an electrode active material, wherein a surface of said electrode is modified by an amorphous lithium borosilicate or doped lithium borosilicate compound, wherein the method comprises:

(a) providing a vapour source of each component element of the amorphous compound, wherein the vapour sources comprise at least a source of lithium, a source of oxygen, a source of boron and a source of silicon, and, optionally, a source of at least one dopant element;

(b) providing an electrode;

(c) delivering a flow of said lithium, said oxygen, said boron and said silicon, and, optionally, said dopant element; and (d) co-depositing the component elements from the vapour sources onto the electrode, wherein the component elements react on the electrode to form the amorphous compound;

wherein the amorphous lithium borosilicate or doped lithium borosilicate compound has a lithium content in the range 45-65 atomic %, a boron content in the range 15-35 atomic %, and a silicon content in the range 10-25 atomic %, based on the combined atomic percentages of lithium, boron and silicon.

15. The method according to claim 14, wherein the vapour sources further comprise a source of nitrogen, and the amorphous compound is nitrogen-doped lithium borosilicate.

16. A surface-modified electrode obtained or obtainable by the method as claimed in claim 14.

17. A battery comprising:

an electrolyte;

a negative electrode; and a positive electrode;

wherein at least one of the negative electrode or positive electrode is the surface-modified electrode according to claim 16.

18. A method of making a battery, comprising depositing an electrolyte of the battery as a layer of an amorphous lithium borosilicate or doped lithium borosilicate compound using the vapour deposition method according to claim 1.

19. A battery comprising:

a positive electrode;

a negative electrode; and an electrolyte;

wherein the electrolyte is in the form of a layer of an amorphous lithium borosilicate or doped lithium borosilicate compound deposited on a substrate using the vapour deposition method according to claim 1.

\* \* \* \* \*